United States Patent
Sugimoto et al.

(10) Patent No.: US 12,020,830 B2
(45) Date of Patent: Jun. 25, 2024

(54) INSULATION-COATED COMPOUND SUPERCONDUCTING WIRE AND REWINDING METHOD THEREOF

(71) Applicant: FURUKAWA ELECTRIC CO., LTD., Tokyo (JP)

(72) Inventors: Masahiro Sugimoto, Tokyo (JP); Hirokazu Tsubouchi, Tokyo (JP); Kota Katayama, Tokyo (JP); Hideki Ii, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 514 days.

(21) Appl. No.: 17/280,666

(22) PCT Filed: Sep. 20, 2019

(86) PCT No.: PCT/JP2019/037011
§ 371 (c)(1),
(2) Date: Mar. 26, 2021

(87) PCT Pub. No.: WO2020/066907
PCT Pub. Date: Apr. 2, 2020

(65) Prior Publication Data
US 2022/0005632 A1 Jan. 6, 2022

(30) Foreign Application Priority Data

Sep. 28, 2018 (JP) .................................. 2018-185631

(51) Int. Cl.
*H01B 12/10* (2006.01)
*H01B 12/14* (2006.01)
(Continued)

(52) U.S. Cl.
CPC ............. *H01B 12/10* (2013.01); *H01B 12/14* (2013.01); *H01F 6/06* (2013.01); *H01F 41/048* (2013.01); *H01B 3/30* (2013.01)

(58) Field of Classification Search
CPC ......... B21C 1/003; B32B 15/01; B32B 15/02; C22C 9/00; C22C 9/02; C22C 27/02;
(Continued)

(56) References Cited

U.S. PATENT DOCUMENTS

2009/0283297 A1* 11/2009 Yasuda .................... H01B 3/30
174/110 SR
2015/0024943 A1 1/2015 Sugimoto et al.
(Continued)

FOREIGN PATENT DOCUMENTS

| EP | 2 838 091 A1 | 2/2015 | |
| JP | H0589726 A * | 4/1993 | ............. Y02E 40/60 |

(Continued)

OTHER PUBLICATIONS

Development Nb-Rod Method CuNb Reinforced Nb3Sn Rutherford Cables_Sugimoto et al._5 pages_Jun. 2015.*
(Continued)

*Primary Examiner* — Timothy J Thompson
*Assistant Examiner* — Guillermo J Egoavil
(74) *Attorney, Agent, or Firm* — Oblon, McClelland, Maier & Neustadt, L.L.P.

(57) ABSTRACT

An insulation-coated compound superconducting wire includes a compound superconducting wire having a compound superconducting part which includes a first matrix and a plurality of compound superconducting filaments containing compound superconducting phases, a reinforcing part disposed on the outer circumferential side of the compound superconducting part and includes a plurality of reinforced filaments, a second matrix and a second stabiliz-
(Continued)

ing material. A stabilizing part is disposed on at least one side among the inner circumferential side and the outer circumferential side of the reinforcing part. An electrical insulation part covers the outer circumferential surface of the compound superconducting wire, in which the insulation-coated compound superconducting wire has a critical current value (Ic) larger than that of the compound superconducting wire before being covered with the electrical insulation part.

19 Claims, 5 Drawing Sheets

(51) Int. Cl.
  *H01F 6/06* (2006.01)
  *H01F 41/04* (2006.01)
  *H01B 3/30* (2006.01)

(58) Field of Classification Search
  CPC ... C22F 1/00; C22F 1/08; H01B 12/10; H01B 12/14; H01B 12/08; H01B 3/30; H01B 13/0026; H01F 41/048; H01F 41/04; H01F 6/06; H10N 60/0128; H10N 60/0184; H10N 60/20; H10N 60/0156; Y02E 40/60; Y10T 29/49014; Y10T 428/12438; Y10T 428/12444; Y10T 428/12778; Y10T 428/12819
  USPC .......... 174/125; 29/599; 428/607, 656, 662; 505/230, 433
  See application file for complete search history.

(56) References Cited

U.S. PATENT DOCUMENTS

| 2016/0163427 A1 | 6/2016 | Pyon et al. |
| 2018/0062180 A1* | 3/2018 | Kim .......................... C25D 1/00 |

FOREIGN PATENT DOCUMENTS

| JP | H10135061 A | * | 5/1998 | ............. H01F 41/06 |
| JP | 2001-126554 A | | 5/2001 | |
| JP | 3674415 B2 | | 7/2005 | |
| JP | 2007-81128 A | | 3/2007 | |
| JP | 2007-305503 A | | 11/2007 | |
| JP | 2007305503 A | * | 11/2007 | ............. Y02E 40/60 |
| JP | 4532369 B2 | | 8/2010 | |
| JP | 5663244 B2 | | 2/2015 | |
| JP | 5718171 B2 | | 5/2015 | |
| JP | 2017-517899 A | | 6/2017 | |
| JP | 6155253 B2 | | 6/2017 | |
| JP | 6182577 B2 | | 8/2017 | |
| KR | 20000073136 A | * | 12/2000 | ............. C25D 21/12 |
| WO | WO 2013/154187 A1 | | 10/2013 | |
| WO | WO 2015/138112 A1 | | 9/2015 | |

OTHER PUBLICATIONS

Conductor Fabrication for ITER Model Coils_Bruzzone et al._2300-2303_Jul. 1996.*
Development Nb-Rod Method CuNb Reinforced Nb3Sn_Sugimoto et al._5 pages_Jun. 2015.*
Nb3Sn Multifilamentary Wire With CuNb Reinforcing Stabilized_Watanabe et al._1006-1009_Mar. 1993.*
Properties of Internal-tin Nb3Sn Strand for ITER_Gregory et al._1319-1328_Jul. 1995.*
International Search Report dated Dec. 3, 2019 in PCT/JP2019/037011 filed Sep. 20. 2019, 1 page.
Yoshio Kubo, et al., "Development of $Nb_3Sn$ Coils with PVF Insulated Wire through the React and Wind Technique," Journal of Cryogenics and Superconductivity Society of Japan, vol. 37, No. 2, 2002, 16 pages (with English machine translation).
Yoshio Kubo, et al., "Derivation of $I_c$ Degradation Rate for Reacted $Nb_3Sn$ Wires under Applied Bending and Tensile Strains," Journal of Cryogenics and Superconductivity Society of Japan, vol. 37, No. 2, 2002, 20 pages (with English machine translation).
Masahiro Sugimoto, et al., "React-and-Wind $Nb_3Sn$ Superconducting Wires for Practical Use: Progress and prospects on the development of elemental technologies," Journal of Cryogenics and Superconductivity Society of Japan, vol. 50, No. 4, 2015, 18 pages (with English machine translation).
Masahiro Sugimoto, et al., "Nb-Rod-Method Cu-Nb/$Nb_3Sn$ Wires for Practical React-and-Wind Applications," IEEE Transactions on Applied Superconductivity, vol. 28, No. 3, Apr. 2018, 5 pages.
Shojiro Ochiai, et al., "Pre-Loading Effect on Critical Current of Multifilamentary $Nb_3Sn$ Superconducting Composite Wire," Journal of Cryogenics and Superconductivity Society of Japan, vol. 30, No. 6, 1995, 15 pages (with English machine translation).
Shojiro Ochiai, et al., "Estimation of strength distribution of $Nb_3Sn$ in multifilamentary composite wire from change in superconducting current due to pre-loading," pp. 440-445.
Extended European Search Report dated May 31, 2022, in corresponding European Patent Application No. 19867242.0, 5 pages.

\* cited by examiner

INSULATION-COATED COMPOUND SUPERCONDUCTING WIRE AND REWINDING METHOD THEREOF

TECHNICAL FIELD

The present invention relates to an insulation-coated compound superconducting wire and a rewinding method thereof, and more particularly to an insulation-coated compound superconducting wire which can be rewound and is suitable for use in a superconducting magnet or the like.

BACKGROUND ART

In the production of a superconducting magnet using a compound superconducting wire such as a $Nb_3Sn$ compound-based superconducting wire or a compound-based superconducting cable of the wire, it is common to apply a so-called wind-and-react process, in which a superconducting wire is wound around a winding frame for superconducting coil to form a magnet and then the magnet is subjected to a compound generation heat treatment. This is due to the fact that heat-treated compound-based superconductive wire such as $Nb_3Sn$ and heat-treated compound-based superconducting cable thereof are very weak against strain and a wire-winding step or the like in which a large strain acts cannot be performed after the heat treatment.

When producing a large magnet such as a high magnetic field accelerator dipole magnet, high magnetic field large diameter magnet, etc., by using wind-and-react process, it is necessary to perform a compound generation heat treatment for generating $Nb_3Sn$ in a furnace under vacuum or in an inert gas atmosphere at a predetermined temperature of 600° C. or higher. In order to perform such a heat treatment, it is necessary to provide a large heat treatment furnace capable of accommodating the entire large magnet. Therefore, there was a problem that the size of the magnet is limited.

Furthermore, in order to produce a compact superconducting magnet with a high magnetic field, it is effective to increase the critical current density of a superconducting conductor so as to make a configuration capable of flowing a large current, and twisting superconducting strands is mentioned as one of the effective means. However, even when compound-based superconducting wires such as $Nb_3Sn$ are twisted, the situation in which a large strain cannot be applied is the same as long as the compound-based superconducting wire such as $Nb_3Sn$ is used, and the above-described problem is not solved.

The reason why the compound superconducting wire such as $Nb_3Sn$ is weak against strain is due to the fact that, in addition to the tendency of the superconductor to become brittle after the heat treatment; the compound-based superconductor wire is constituted as a composite material including a plurality of materials different from each other, thus, thermal shrinkage of the respective materials constituting the compound-based superconductor wire differs from each other when cooled, and compressive residual strain in the superconductor is generated. Meanwhile, a reinforced $Nb_3Sn$ superconducting wire in which a reinforcing material such as Cu—Nb and $CuAl_2O_3$ is contained has been recently developed and by the improvement of its strength, a magnet can be manufactured even by a so-called react-and-wind process, in which a wire is subjected to heat treatment to obtain a superconducting wire, and then the obtained wire is wound to form a superconducting coil.

A method for producing a conventional compound-based superconducting coil by react-and-wind process is disclosed, for example, in Patent Documents 1 to 6 and Non-Patent Documents 1 to 4.

Patent Document 1 discloses a compound superconducting wire, which includes a compound superconducting bare wire containing a compound superconducting phase formed, and which is coated with enamel on the wire. The compound superconducting wire is characterized in that the enamel coating is performed under the condition in which a plurality times of bending with a bending radius of 50 times larger than the minimum width of the cross section of the compound superconducting bare wire and tension of 70 MPa or less are applied to the compound superconducting bare wire.

Non-Patent Documents 1 and 2 also disclose an $Nb_3Sn$ coil, to which formal (PVF) insulation is applied and which is produced by the react-and-wind process.

However, all of the producing methods of the compound superconducting wire described in these documents require that processing conditions of enamel coating be strictly controlled so that bending strain and internal stress which damage the wire are not applied, thus prolonging the production time and making it difficult to stably and efficiently produce a superconducting wire having good superconducting properties. Further, since a reinforcing material such as Cu—Nb is not disposed on the outer circumferential side of an aggregate (compound superconductor part) of compound superconducting fine wires, there is a problem that the strength of the entire compound superconducting wire after enamel coating is low and the compound superconducting wire is easily damaged when the compound superconducting wire is wound by the react-and-wind process.

For this reason, in Patent Documents 2 to 6 and Non-Patent Documents 3 and 4, the Applicant has proposed several techniques for producing a compound superconducting wire in which a reinforcing material such as Cu—Nb is disposed on the outer circumferential side of the compound superconductor part by the react-and-wind process.

Patent Document 2 discloses a technique for increasing strength of a compound superconducting wire as a whole by placing a reinforcing material (reinforcing part) in which a reinforcing filament such as Nb having an equivalent diameter of 0.3 µm or less is embedded in copper or the like, around a group of compound superconducting filaments (compound superconductor).

Patent Document 3 discloses a technique for improving superconducting properties of a compound superconducting wire: bending strain is applied 5 times or more and 20 times or less within a range of 0.5% or more and 1.0% or less on the basis of the wire surface in a double bending processing step applying a double bending processing in which bending strain is applied from both the positive and negative directions to a compound superconducting wire obtained by the heat treatment step, in order to improve superconducting characteristics such as strain resistance characteristics and critical current over conventional technology by relaxing strain remaining inside the compound superconducting wire after heat treatment.

Patent Document 4 discloses a technique for forming a superconducting coil having improved superconducting characteristics: in the technique, a bending processing including application of each of bending strain of −(0.1 to 0.6)% and that of +(0.1 to 0.6)% twice or more to a compound-based superconducting wire after heat treatment is performed, and then the wire is wound while applying bending strain continuously limiting within a range of ±0.7%.

Patent Document 5 discloses a technique, in which, in a step including applying an insulation coating layer to a reinforced $Nb_3Sn$ superconducting wire, the reinforced $Nb_3Sn$ superconducting wire is passed through an insulation application apparatus a plurality of times, whereby double bending processing is performed one or more times without using an exclusive pass line for applying bending strain.

Patent Document 6 discloses a technique in which bending strain is applied to a reinforced $Nb_3Sn$ superconducting twisted wire subjected to generation heat treatment, from both positive and opposite directions, within a range of 0.5% or more and 1.0% or less, whereby strain inside the superconducting twisted wire can be relaxed, and moreover superconducting characteristics such as a critical current can be improved.

Non-Patent Documents 3 and 4 disclose the results of studies, such as improvement in critical current by application of pre-bending strain, toward practical use of CuNb reinforced $Nb_3Sn$ superconducting wire produced by the react-and-wind process.

However, all the production methods disclosed in Patent Documents 2 to 6 and Non-Patent Documents 3 and 4 employ the react-and-wind process, and reinforced superconducting wires produced by such methods have more excellent superconducting characteristics than conventional superconducting wires without a reinforcing material as disclosed in Patent Document 1, etc. However, in recent years, the reinforced superconducting wire is required to flow much larger currents under required operating conditions (magnetic field, temperature, applied stress), when the reinforced superconducting wire is applied to superconducting coil of various specifications, such as a superconducting coil generating a low magnetic field, a medium magnetic field, or a high magnetic field. Thus, further improvement in the reinforced superconducting wire is required.

Patent Document 1: Japanese Patent No. 3674415
Patent Document 2: Japanese Patent No. 6155253
Patent Document 3: Japanese Patent No. 4532369
Patent Document 4: Japanese Patent No. 6182577
Patent Document 5: Japanese Unexamined Patent Application, Publication No. 2007-81128
Patent Document 6: Japanese Patent No. 5718171
Non-Patent Document 1: Yoshio Kubo and three others, "Development of $Nb_3Sn$ Coils provided with PVF insulation by React & Wind (R&W) method", Teion Kogaku (Cryo-Engineering), Cryogenics and Superconductivity Society of Japan, 2002, Vol. 37, No. 2, pp. 61-67
Non-Patent Document 2: Yoshio Kubo and one other, "Derivation of Ic-Degradation Rate of $Nb_3Sn$ Wire during Application of Bending and Tensile Strain", Teion Kogaku (Cryo-Engineering), Cryogenics and Superconductivity Society of Japan, 2002, Vol. 37, No. 2, pp. 68-76
Non-Patent Document 3: Masahiro Sugimoto and five others, "Practical Application of React-and-Wind Type $Nb_3Sn$ Superconducting Wires—Present State and Prospect of Elemental Technology Development", Teion Kogaku (Cryo-Engineering), Cryogenics and Superconductivity Society of Japan, 2015, Vol. 50, No. 4, pp. 172-179
Non-Patent Document 4: Masahiro Sugimoto, et al., "Nb-Rod-Method Cu—Nb/$Nb_3Sn$ Wires for Practical React-and-Wind Applications", IEEE Trans. Appl, Super., IEEE, 2018, Vol. 28, No. 3, p. 6000105
Non-Patent Document 5: Ochiai and four others, "Preloading Effects on Critical Current of $Nb_3Sn$ Multi-Core Composite Wires", Teion Kogaku (Cryo-Engineering), 1995, Vol. 30, No. 6, pp. 285-291
Non-Patent Document 6: Ochiai, et. al., "Estimation of Strength Distribution of $Nb_3Sn$ in Multifilamentary Composite Wire from Change in Superconducting Current due to PreLoading". J. Appl. Phys., 1993, Vol. 74, No. 1, pp. 440-445

DISCLOSURE OF THE INVENTION

Problems to be Solved by the Invention

An object of the present invention is to provide an insulation-coated compound superconducting wire which is excellent in wire winding property and which is used in superconducting coils. The insulation-coated compound superconducting wire of the present invention includes an electric insulation part appropriately provided on the outer circumferential surface of the compound superconducting wire having a reinforcing part, and thereby, has not only excellent superconducting characteristics but also a tensile strength equal to or larger than that of the conventional compound superconducting wire at both room temperature (e.g., 10 to 35° C.) and extremely low temperature (e.g., 4.2 K). Such insulation-coated compound superconducting wire is excellent in wire winding property and enables a superconducting coil to be commercially produced. An additional object of the present invention is to provide a rewinding method thereof.

Means for Solving the Problems

The present inventors have made extensive research to develop superconducting wire capable of conducting large currents under required operating conditions (magnetic field, temperature, applied stress) when the superconducting wire is applied to a superconducting coil of various specifications using not only immersion cooling but also conductive cooling by a refrigerator or the like and generating a low magnetic field, medium magnetic field or a high magnetic field. As a result, the present inventors have found that by forming a coating of an electric insulation part on an outer circumferential surface of a compound superconducting wire having a reinforcing part, the critical current value (Ic) is increased as compared with a compound superconducting wire before being coated with the electric insulation part. The present invention has been completed based on these findings.

That is the gist of the configuration of the present invention is as follows:

A first aspect of the present invention relates to an insulation-coated compound superconducting wire, including: a compound superconducting wire including a core-like compound superconductor part, a cylindrical reinforcing part, and a cylindrical stabilizing part; and an electric insulation part coating an outer circumferential surface of the compound superconducting wire, in which the core-like compound superconductor part includes a plurality of compound superconducting filaments and a first matrix, the compound superconducting filaments each including a compound superconducting phase, the first matrix including the plurality of compound superconducting filaments embedded therein and a first stabilizing material, in which the cylindrical reinforcing part is disposed on an outer circumferential side of the compound superconductor part, and includes a plurality of reinforcing filaments and a second matrix, the second matrix including the plurality of reinforcing filaments embedded therein and a second stabilizing material, in which the cylindrical stabilizing part is disposed on at least one side of an inner circumferential side and an outer circumferential side of the reinforcing part, and includes a third stabilizing material, and in which the insulation-coated compound superconducting wire has a critical current value (Ic) larger than that of the compound superconducting wire before being coated with the electric insulation part.

A second aspect of the present invention relates to the insulation-coated compound superconducting wire as described in the first aspect, in which the compound superconducting phase includes $Nb_3Sn$, and each of the critical current value (Ic) is obtained by applying predetermined tensile stress of 150 MPa or more and 250 MPa or less at room temperature to the insulation-coated compound superconducting wire or the compound superconducting wire before being coated with the electric insulation part, followed by unloading, then cooling the wire to a temperature of 4.2 K, and then conducting electric current through the wire in a state of being unloaded the tensile stress and being applied an external magnetic field of 14.5 T.

A third aspect of the present invention relates to the insulation-coated compound superconducting wire as described in the first aspect, in which the compound superconducting phase includes $Nb_3Sn$, and each of the critical current value (Ic) is obtained by cooling the insulation-coated compound superconducting wire or the compound superconducting wire before being coated with the electric insulation part to a temperature of 4.2 K, and then conducting electric current through the wire in a state of being applied a predetermined tensile stress of 150 MPa or more and 250 MPa or less and being applied an external magnetic field of 14.5 T.

A fourth aspect of the present invention relates to the insulation-coated compound superconducting wire as described in the second or third aspect, in which the insulation-coated compound superconducting wire has a smaller tensile stress at which the critical current value (Ic) becomes maximum than that of the compound superconducting wire before being coated with the electric insulation part.

A fifth aspect of the present invention relates to the insulation-coated compound superconducting wire as described in any one of the first to fourth aspects, further including a Sn diffusion prevention part between the compound superconductor part and the reinforcing part.

A sixth aspect of the present invention relates to the insulation-coated compound superconducting wire as described in the fifth aspect, in which the compound superconducting phase includes $Nb_3Sn$, the first stabilizing material includes Cu or a Cu alloy, the Sn diffusion prevention part includes Nb or Ta, or an alloy or composite thereof, the reinforcing filament includes at least one metal or an alloy of two or more metals selected from the group consisting of Nb, Ta, V, W, Mo, Fe, Ti, and Hf, the second stabilizing material includes Cu or a Cu alloy, and the third stabilizing material includes Cu or a Cu alloy.

A seventh aspect of the present invention relates to the insulation-coated compound superconducting wire as described in any one of the first to sixth aspects, in which the electric insulation part includes a resin material.

An eighth aspect of the present invention relates to the insulation-coated compound superconducting wire as described in the seventh aspect, in which the resin material is enamel coating or polyimide tape.

A ninth aspect of the present invention relates to the insulation-coated compound superconducting wire as described in any one of the first to eighth aspects, in which a volume ratio of the reinforcing part relative to the compound superconducting wire is larger than a volume ratio of the compound superconductor part relative to the compound superconducting wire.

A tenth aspect of the present invention relates to the insulation-coated compound superconducting wire as described in any one of the first to ninth aspects, in which a total of a volume ratio of the second stabilizing material relative to the compound superconducting wire and a volume ratio of the third stabilizing material relative to the compound superconducting wire is 45% or more.

An eleventh aspect of the present invention relates to the insulation-coated compound superconducting wire as described in the fifth or sixth aspect, in which a total of a volume ratio of the reinforcing filament relative to the compound superconducting wire and a volume ratio of the Sn diffusion prevention part relative to the compound superconducting wire is 7% or more.

A twelfth aspect of the present invention relates to the insulation-coated compound superconducting wire as described in the eleventh aspect, in which the total of the volume ratio of the reinforcing filament relative to the compound superconducting wire and the volume ratio of the Sn diffusion prevention part relative to the compound superconducting wire is 15% or more.

A thirteenth aspect of the present invention relates to the insulation-coated compound superconducting wire as described in any one of the first to twelfth aspects, further including a heat-resistant plated part having a thickness of 1 μm or less between the outer circumferential surface of the compound superconducting wire and the electric insulation part.

A fourteenth aspect of the present invention relates to the insulation-coated compound superconducting wire as described in any one of the first to thirteenth aspects, in which the insulation-coated compound superconducting wire is obtained by, within a temperature range from room temperature to 500° C., applying tensile strain of 0.2% or less to the compound superconducting wire and applying bending strain within ±0.5% to the compound superconductor part at least 10 times, between the time of forming the compound superconducting wire by performing heat treatment of the compound superconducting phase in a state of being bent and wound a compound superconducting precursor strand around a winding member with a bending diameter corresponding to 100 times larger than the maximum diameter of the compound superconductor part, and the time of finishing the coating of the electric insulation part to the outer circumferential surface of the compound superconducting wire.

A fifteenth aspect of the present invention relates to the insulation-coated compound superconducting wire as described in the fourteenth aspect, further including a mark on a surface of the electric insulation part along a longitudinal direction of the insulation-coated compound superconducting wire, the mark indicating a direction in which the insulation-coated compound superconducting wire should be bent.

A sixteenth aspect of the present invention relates to a method for rewinding the insulation-coated compound superconducting wire as described in any one of the first to fifteenth aspects, from a first winding member to a second winding member, including: winding off the insulation-coated compound superconducting wire from the first winding member in a tangential direction of the first winding member; and winding the insulation-coated compound superconducting wire around the second winding member, while bending the insulation-coated compound superconducting wire in the same direction as the direction in which the insulation-coated compound superconducting wire was wound around the first winding member.

Effects of the Invention

The insulation-coated compound superconducting wire of the present invention adopts a configuration including: a compound superconducting wire including a core-like compound superconductor part, a cylindrical reinforcing part, and a cylindrical stabilizing part; and an electric insulation part coating an outer circumferential surface of the compound superconducting wire, in which the core-like compound superconductor part includes a plurality of compound superconducting filaments and a first matrix, the compound superconducting filaments each including a compound superconducting phase, the first matrix including the plurality of compound superconducting filaments embedded therein and a first stabilizing material, in which the cylindrical reinforcing part is disposed on an outer circumferential side of the compound superconductor part, and includes a plurality of reinforcing filaments and a second matrix, the second matrix including the plurality of reinforcing filaments embedded therein and a second stabilizing material, in which the cylindrical stabilizing part is disposed on at least one side of an inner circumferential side and an outer circumferential side of the reinforcing part, and includes a third stabilizing material, and in which the insulation-coated compound superconducting wire has a critical current value (Ic) larger than that of the compound superconducting wire before being coated with the electric insulation part. Thereby, it is possible to provide an insulation-coated compound superconducting wire for practical use, which has an excellent superconducting property, exhibits a tensile strength equal to or larger than that of the conventional superconducting wire at both room temperature (e.g., 10 to 35° C.) and cryogenic temperature (e.g., 4.2 K), also has excellent in wire winding property, and enables a superconducting coil to be commercially produced.

PREFERRED MODE FOR CARRYING OUT THE INVENTION

Subsequently, preferable embodiments of the insulation-coated compound superconducting wire according to the present invention is explained in detail below.

Insulation-Coated Compound Superconducting Wire

Figure 1:
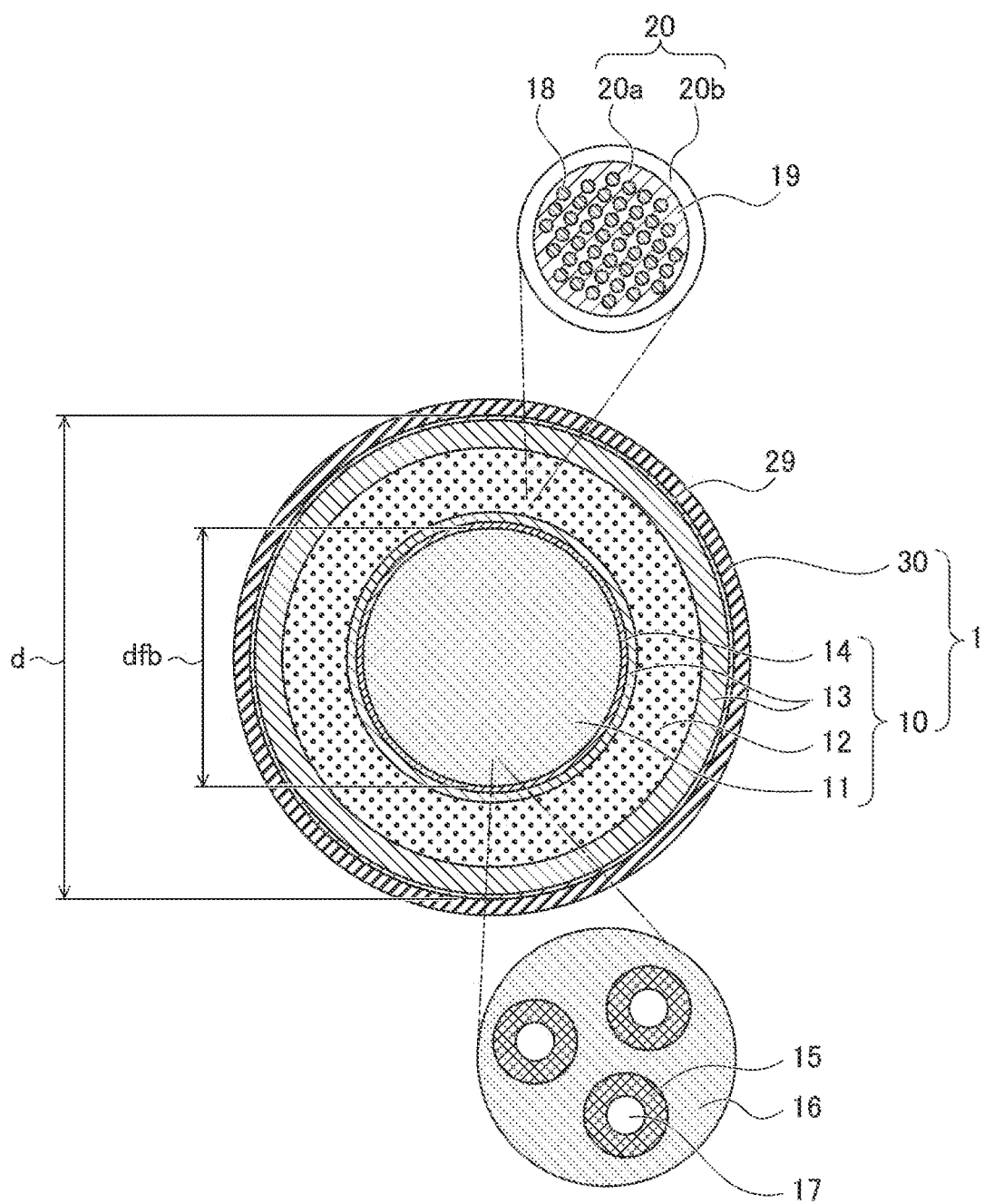
FIG. 1 is a schematic diagram illustrating a cross-section of an insulation-coated compound superconducting wire according to an embodiment of the present invention.

FIG. 1 is a schematic diagram illustrating a cross-section structure of the insulation-coated compound superconducting wire 1 according to an embodiment of the invention. The insulation-coated compound superconducting wire 1 of the present embodiment illustrated in FIG. 1 mainly includes a compound superconducting wire 10 and an electric insulation part 30 coating an outer circumferential surface of the compound superconducting wire 10.

<Compound Superconducting Wire>

The compound superconducting wire 10 mainly includes a compound superconductor part 11, a reinforcing part 12, and a stabilizing part 13.

(Compound Superconductor Part)

The compound superconductor part 11 mainly includes a plurality of compound superconducting filaments 15 each including a compound superconducting phase, and a first matrix 16 including the plurality of compound superconducting filaments 15 embedded therein and a first stabilizing material. The compound superconductor part 11 forms a core-like shape as a whole.

The compound superconducting phase is preferably a metal compound superconducting phase including $Nb_3Sn$ (niobium-tin), but is not limited thereto, and may include, for example, $Nb_3Al$ (niobium-aluminum) or other compound superconducting phases having superconducting properties.

The first stabilizing material constituting the first matrix 16 is preferably copper (Cu) or a copper alloy. By disposing the first matrix 16, it is possible to achieve an effect of suppressing damage to the compound superconductive filament 15, providing magnetic stabilization, and thermal stabilization in the insulation-coated compound superconducting wire 1.

Note that FIG. 1 shows a compound superconductor part 11 produced by a so-called bronze process, in which a plurality of Nb filaments are embedded in a first matrix precursor (first matrix before heat treatment) of Cu—Sn (copper-tin)-base alloy, which is the first stabilizing material, the embedded Nb filaments are subjected to drawing processing, etc. to form a compound superconducting precursor strand; the compound superconducting precursor strand is subjected to heat treatment; this diffuses Sn in the first matrix precursor and allows the Sn to react with surfaces of Nb filaments; and thereby an $Nb_3Sn$ filament is formed from the Nb filament. The enlarged view of the compound superconductor part 11 shown in FIG. 1 indicates a case in which a core portion 17 of unreacted Nb remaining without reacting with Sn exists. However, with respect to the compound superconductor part 11, it is possible to produce the compound superconducting filament 15 after heat treatment as a filament in which the core portion 17 of unreacted Nb does not exist and all of which consists of $Nb_3Sn$, depending on the amount of Sn contained in the first matrix precursor and a diameter size of the Nb filament before heat treatment.

Further, Cu—Sn (copper-tin) base alloy of the first matrix precursor can contain 15.8 mass % of Sn at the maximum (solid solution limit). In addition, elements other than Cu and Sn may be contained as long as they are in small amounts, and it is preferable to contain, for example, Ti or the like in a range of 0.2 to 0.3 mass %.

On the other hand, it is necessary to take into consideration that even though an Sn content in the Cu—Sn base alloy which constitutes the first matrix 16 is typically reduced to about 1 to 2 mass % after the $Nb_3Sn$ generation heat treatment, depending on the heat treatment conditions, as a result of being used to produce an $Nb_3Sn$ filament 15, a function as a stabilizer substantially corresponding to Cu is not exhibited.

(Reinforcing Part)

The reinforcing part 12 includes a plurality of reinforcing filaments 18 and a second matrix 19 including a second stabilizing material 20, is disposed on the outer circumferential side of the compound superconductor part 11, and has a cylindrical shape as a whole. Further, the reinforcing part 12 is obtained by embedding a plurality of reinforcing filaments 18 in the second matrix 19.

It is preferable that the reinforcing filament 18 is formed by mainly containing at least one metal or an alloy of two or more metals selected from the group consisting of Nb, Ta, V, W, Mo, Fe, Ti, and Hf. Herein, it should be noted that the reinforcing filament 18 "mainly contains" refers to the point that unavoidable impurities may be contained therein.

For example, a reinforcing filament 18 which mainly contains Nb may contain some unavoidable impurities including O: 150 ppm or less, H: 15 ppm or less, C: 100 ppm or less, N: 100 ppm or less, Fe: 50 ppm or less, Ni:50 ppm or less, Ti: 20 ppm or less, Si: 50 ppm or less, W: 300 ppm or less, and Ta: 1,000 ppm or less. Further, a reinforcing filament 18 which mainly contains Ta may contain some unavoidable impurities including O, H, C, N, Fe, Ni, Ti, Si, W, Nb, and Mo.

Since these metals or alloys constituting the reinforcing filament 18 do not easily dissolve in Cu as a solid during the heat treatment of the compound superconductor generation, a compound with Cu is unlikely to be easily formed. Therefore, these metals or alloys effectively contribute to improvement in bending strain properties. It should be noted that in the embodiment of the present invention, as a material constituting the reinforcing filament 18, Nb, Ta, V, W, Mo and Hf which do not exhibit ferromagnetism are preferred, considering an effect on the insulation-coated compound superconducting wire 1, and further, Nb, Ta or V is preferred from the viewpoint of workability.

Further, as the alloy including two or more metals selected from the above-described group, an Nb—Ta alloy is preferred in the point of excellency in composite workability with copper or a copper alloy. As an alloy including a metal selected from the group and copper, a Cu—Nb alloy or a Cu—V alloy is preferred in the point of excellency in composite workability with copper or a copper alloy.

It should be noted that the description "not easily dissolve in Cu" as described above refers to the point that a metal or an alloy constituting the reinforcing filament 18 dissolves in Cu as a solid in a content of less than 1 at. % at a temperature during the heat treatment (e.g., 600° C. to 750° C.) to form the compound superconductor.

As described above, by adopting a configuration of the reinforcing part 12 in which a plurality of the reinforcing filaments 18 mainly containing a metallic material which does not easily dissolve in Cu as a solid are embedded in the second matrix 19, it is possible to suppress the formation (existence) of an intermetallic compound in the reinforcing filament 18 in the reinforcing part 12, and thereby to form a reinforcing member having high strength against tensile strain and bending strain. It should be noted that in FIG. 1, the second stabilizing material 20 constituting the reinforcing part 12 is configured by a portion 20a which embeds the reinforcing filaments 18 and a cylindrical outer circumferential portion 20b surrounding the outer circumference of the embedding portion 20a as different portions. However, these portions 20a and 20b can may be integrally configured.

It is preferable that the second stabilizing material 20 mainly contains copper or a copper alloy. It should be noted that the second stabilizing material 20 "mainly contains" refers to the point that unavoidable impurities may be contained. Herein, the unavoidable impurities include O, Fe, S and Bi. By disposing the second stabilizing material 20, it is possible to achieve effects that the reinforcing part 12 can have not only a strengthening function but also a stabilizing function.

Further, the volume ratio of the reinforcing part 12 relative to the compound superconducting wire 10 is preferably 40% or more, and more preferably 45% or more. By setting the volume ratio to 40% or more, the tensile strength can be effectively improved. It should be noted that the upper limit of the volume ratio is preferably set to 65% or less, from the viewpoint of ensuring a critical current.

The volume ratio (%) of the reinforcing part 12 relative to the compound superconducting wire 10 is preferably larger than the volume ratio (%) of the compound superconductor part 11 relative to the compound superconducting wire 10. Specifically, the volume ratio (%) of the reinforcing part 12 relative to the compound superconducting wire 10 is preferably 4% or more, and more preferably 10% or more. Generally, when the volume ratio of the reinforcing part 12 is larger than the volume ratio of the compound superconductor part 11, the tensile strength as the compound superconducting wire 10 is increased, but the critical current tends to decrease. This is because the volume ratio of the compound superconductor part 11 becomes relatively small. In the present invention, as described below, the critical current can be increased by providing the insulation coating and thereby it is possible to improve the tensile strength while suppressing a decrease in the critical current and maintaining the critical current at the same level as the critical current of prior art. It should be noted that if the volume ratio (%) of the reinforcing part 12 relative to the compound superconducting wire 10 is too large, good superconducting properties cannot be obtained. Therefore, the volume ratio (%) of the reinforcing part 12 is preferably not larger than 45% with respect to the volume ratio (%) of the compound superconductor part 11 relative to the compound superconducting wire 10.

(Stabilizing Part)

The stabilizing part 13 is disposed on at least one side of the inner circumferential side and the outer circumferential side of the reinforcing part 12. In FIG. 1, the stabilizing parts 13 are disposed on both the inner circumferential side and the outer circumferential side of the reinforcing part 12. The stabilizing part 13 includes a third stabilizing material and forms a cylindrical shape as a whole. By disposing the stabilizing part 13, it is possible to suppress abnormal deformation during processing of the reinforcing part 12 and to provide a stabilizing function.

It is preferable that the third stabilizing material mainly includes copper or a copper alloy. It should be noted that "mainly includes" in the third stabilizing material refers to the point that unavoidable impurities may be contained. Here, the unavoidable impurities include O, Fe, S and Bi.

Further, it is preferable that the total of the volume ratio (%) of the second stabilizing material constituting the reinforcing part 12 and the volume ratio of the third stabilizing material constituting the stabilizing part 13 relative to the compound superconducting wire 10 is 45% or more. By setting the total of the volume ratio of the second stabilizing material in the reinforcing part 12 and the volume ratio of the third stabilizing material constituting the stabilizing part 13, which are disposed on the outer side of the compound superconductor part 11, to 45% or more, the insulation-coated compound superconducting wire 1 can have stabilizing materials at a sufficiently large volume ratio, and it is possible to ensure the electrification stability.

In the insulation-coated compound superconducting wire 1 of the present invention, the first stabilizing material constituting the compound superconductor part 11, the second stabilizing material constituting the reinforcing part 12, and the third stabilizing material constituting the stabilizing part 13 are used, herein the "stabilizing material" refers to a material, generally a metal, which is electrically and/or thermally in contact with a superconductor so as to ensure thermal contact with a refrigerant and/or act as an electric shunt circuit, as defined in JIS H 7005: 2005. The stabilizing material refers to normal conducting metal material which is complexed to a superconductor to enhance stability of the superconductor. Specifically, normal conducting metals such as copper and aluminum have good thermal conductivity and low specific resistance at cryogenic temperature, so that when used as a matrix for a superconducting wire, electric current flows through these normal conducting metals as bypass even if there is transition from the superconducting state to the normal conducting state. Thus, heat generation is suppressed, and the generated heat is rapidly propagated and diffused, and then it is cooled. Furthermore, normal conducting metals such as copper and aluminum, which dump external magnetic flux variation and do not directly transmit magnetic flux variation to the superconductor, are widely used as the stabilizing material for the superconducting wire.

(Optional Component of Compound Superconducting Wire)

A compound superconducting wire 10 constituting the insulation-coated compound superconducting wire 1 of the present invention includes the compound superconductor part 11, the reinforcing part 12, and the stabilizing part 13 as essential components, but may further have other components.

For example, it is possible to dispose a Sn diffusion prevention part 14 between the compound superconductor part 11 and the reinforcing part 12. It is also possible to provide a heat-resistant plated part 29 having a thickness of 1 μm or less between the outer circumferential surface of the compound superconducting wire 10 and the electric insulation part 30.

The Sn diffusion prevention part 14 preferably includes Nb or Ta or an alloy or composite thereof. The Sn diffusion prevention part 14 has a function of preventing Sn in a Cu—Sn base alloy, which constitutes the first matrix 16 to form the $Nb_3Sb$ filament in the compound superconductor part 11, from diffusing into the reinforcing part 12 or the stabilizing part 13, and thereby not only suppressing decrease in the residual resistance ratio of the second and third stabilizing materials, which constitute the reinforcing part 12 and the stabilizing part 13, but also retaining a Sn quantity required to react with an Nb filament to produce $Nb_3Sn$ in the Cu—Sn base alloy.

The total of the volume ratio of the reinforcing filament 18 constituting the reinforcing part 12 and the volume ratio of the Sn diffusion prevention part 14 relative to the compound superconducting wire 10 is preferably 7% or more, and more preferably 15% or more. Since the total of the volume ratio of the reinforcing filament 18 in the reinforcing part 12 and the volume ratio of the Sn diffusion prevention part 14 is 7% or more, it is possible to enhance the strength of the compound superconducting wire 10 itself, to improve rewindability of the compound superconducting wire 10, and to facilitate the react-and-wind process. These volume ratios can be freely designed depending on the characteristics and volume of the compound superconductor part 11.

Further, the total of the volume ratio of the compound superconductor part 11 and the volume ratio of the Sn diffusion prevention layer 14 can be freely designed according to the critical current required in the compound superconducting wire 10, but is preferably 20% or more, and more preferably 30% or more. When the total of the volume ratio is 20% or more, it is possible to attain a practical critical current value in the superconducting wire obtained by using the react-and-wind process.

Furthermore, a current-carrying capacity can be increased by using as the compound superconducting wire 10, which constitutes the insulation-coated compound superconducting wire 1 of the present invention, having a large wire diameter. Further, an allowable bending diameter can be decreased by using a superconducting wire 10 having a small wire diameter. Thereby, it is possible to obtain an appropriate superconducting wire, depending upon each of the superconducting application apparatuses. The wire diameter of the compound superconducting wire 10 is preferably in a range of 0.2 mm or more and 2.0 mm or less. This is because when the wire diameter is larger than 2.0 mm, flexibility becomes poor, and the handling property tends to be poor, and when the wire diameter becomes smaller than 0.2 mm, the strength of the compound superconducting wire 10 itself becomes weak, so that the handling property tends to be poor.

<Electric Insulation Part>

In the insulation-coated compound superconducting wire 1 of the present embodiment, an electric insulation part 30 covers the outer circumferential surface of the compound superconducting wire 10, and thereby, the critical current value (Ic) of the insulation-coated compound superconducting wire 1 is larger than the critical current value (Ic) of the compound superconducting wire 10 before being covered with the electric insulation part 30.

The electric insulation part 30 preferably includes a resin material. The resin material is not particularly limited, but it is preferable to use enamel coating or polyimide tape. Examples of the enamel coating include polyvinyl formal resin (PVF), polyamideimide resin (PAI), polyimide resin (PI), etc. The polyimide tape may be coated with a self-fusing resin or a prepreg resin.

Herein, for example, in the conventional compound superconducting wire having an enamel coating as described in Patent Document 1 or the like, a reinforcing part such as Cu—Nb is not disposed on the outer circumferential side of an assembly (compound superconductor part) of compound superconducting fine wires. Therefore, the strength of the wire before the enamel coating is applied is low, and the condition of a pre-bending strain application step described below and the processing condition of the enamel coating must be strictly controlled so as not to damage the wire like applications of bending strain and internal stress. Additionally, the strength of the entire compound superconducting wire after the enamel coating is also low, and when the winding as in react-and-wind process accompanies rewinding, the compound superconducting wire is easily damaged.

These damages to the compound superconducting wire lower the critical current values (Ic) of the compound superconducting wire.

In addition, Patent Document 5 and the like proposed by the present applicant disclose an Example in which an insulating coating of the polyimide tape was applied to the compound superconducting wire having a reinforcing material. However, at that time, control of the strain of the compound superconducting wire was not sufficient. Further, since the insulating coating was merely applied to the compound superconducting wire only to provide the compound superconducting wire with insulation performance, the insulation-coated compound superconducting wire shown in the Example was not the one obtained by forming insulating coating in order to improve the superconductive characteristics as compared with the compound superconducting wire before the insulation coating was applied.

In contrast, the present inventors have found that a decrease in residual strain generated in the compound superconducting wire when forming the electric insulation part improves the critical current value (Ic), and as a result, the critical current value (Ic) of the insulation-coated compound superconducting wire 1 can be made larger than the critical current value (Ic) of the compound superconducting wire 10 before being coated with the electric insulation part 30.

With respect to the measurement conditions of the critical current value Ic of the insulation-coated compound superconducting wire 1 and the compound superconducting wire 10, the critical current value can be measured according to any of the following <measurement condition A> and <measurement condition B> when the compound superconducting phase is, for example, $Nb_3Sn$.

{Measure of Critical Current Value Ic}

<Measurement Condition A>

A predetermined tensile stress of 150 MPa or more and 250 MPa or less is applied at room temperature to each of the insulation-coated compound superconducting wire 1 and the compound superconducting wire 10 before being coated with the electric insulation part 30, followed by unloading, then each of the wires is cooled to a temperature of 4.2 K, and the critical current value (Ic) is measured by conducting electric current through each of the wires while the tensile stress is unloaded and an external magnetic field of 14.5 T is applied. Herein, a strain rate for applying the predetermined tensile stress is set to $10^{-4}$ to $10^{-3}$/s. It should be noted that the "room temperature" in the present invention refers to a temperature in the range from 10° C. to 35° C. Further, the tensile stress of the insulation-coated compound superconducting wire 1 is obtained by excluding the electric insulation part 30 from the insulation-coated compound superconducting wire 1, that is, the tensile stress of the insulation-coated compound superconducting wire 1 is per compound superconducting wire. To measure the critical current value (Ic), a four-terminal method is applied. A sample length is set to 40 mm or more, a distance between voltage taps is set to 10 mm or more, and the critical current value is determined following the definition of 10 μV/m, using an n value determined in the electric field of 100 μV/m to 1,000 μV/m based on the characteristics (V is proportional to $I^n$) of conducted current I measured and generated voltage V. It should be noted that in order to attach electrodes to the insulation-coated compound superconducting wire 1, when the critical current value (Ic) is measured, the electric insulation part 30 may be removed from the insulation-coated compound superconducting wire 1. The electric insulation part 30 may be completely removed or partially removed at both ends. When the electric insulation part 30 is removed, attention should be paid so that stress to an extent that changes the critical current values (Ic) of the insulation-coated compound superconducting wire 1 is not applied to the compound superconducting wire 10.

<Measurement Condition B>

Each of the insulation-coated compound superconducting wire 1 and the compound superconducting wire 10 before being coated with the electric insulation part 30 is cooled to a temperature of 4.2 K, and the critical current value (Ic) is measured by conducting electric current through each of the wires while a predetermined tensile stress of 150 MPa or more and 250 MPa or less and an external magnetic field of 14.5 T are applied. Other conditions are the same as those of the measurement condition A described above.

Generally, it is known that when a magnet is constructed by making a superconducting wire into a coil-like shape and then this magnet is cooled to operate in a superconducting state, tensile stress is applied to the superconducting wire in the axial direction of the superconducting wire by an electromagnetic force (hoop force). Therefore, when the critical current of a superconducting wire used for magnet is evaluated, it is necessary to measure the critical current while tensile stress reflecting actual operation conditions is applied so as to experience tensile strain for the superconducting wire.

In the measurement condition B, it is assumed that when magnets each including the insulation-coated compound superconducting wire 1 or the compound superconducting wire 10 before being coated with the electric insulation part 30 are cooled to 4.2 K and operated in superconducting states, a hoop force is generated in the respective superconducting wires 1 and 10. The critical currents are measured while applying tensile stress at 4.2 K to each of the superconducting wires 1 and 10 in the axial direction. By applying tensile strain to the respective superconducting wires 1 and 10, a state of strain in the compound superconductor part changes. When the compressive strain applied to the compound superconductor in the initial state becomes zero due to application of tensile strain, the critical current value reaches a maximum, and thereafter, the critical current value decreases with increasing tensile strain. When excessive tensile strain is applied, breakage of superconducting filament in the compound superconducting wire occurs and deterioration occurs, and the critical current value does not return to the original value even when the tensile strain is unloaded. In particular, a superconducting filament in which deterioration of the critical current due to superconducting filament breakage occurs at a strain corresponding to predetermined tensile stress of 150 MPa or more and 250 MPa or less at 4.2 K is not suitable for practical use.

In the measurement condition A, a tensile stress equivalent to that applied in the measurement condition B is applied at room temperature, followed by unloading (preloading treatment), and then the critical current is measured at 4.2 K. This preloading treatment can change the final residual strain after cooling to 4.2 K, which is residual strain subjected to the compound superconducting filaments, widely from compression to zero and even to tensile (preloading effect) by changing load stress level.

Measurement condition A allows a simple and convenient evaluation since tensile stress can be applied at room temperature. However, when the strength of the superconducting wire itself is insufficient, or when the compressive stress of the compound superconductor is overly relaxed, for example, due to pre-bending strain, application of excessive tensile strain at room temperature results in localized filament breakage of the superconducting filament beyond the elastic strain range. Thus, after unloading, deterioration of the critical current measured at 4.2 K occurs. In particular, if breakage of superconducting filament occurs in a state in which strain corresponding to a predetermined tensile stress of 150 MPa or more and 250 MPa or less is applied at room temperature, followed by unloading, deterioration of the critical current after cooling to 4.2 K occurs. Therefore, it is not suitable for practical use in the react-and-wind process.

However, when evaluated under any of the conditions, no event of concern occurred, and the insulation-coated compound superconducting wire 1 according to the present invention was confirmed to have a critical current increased after the electric insulation part 30 was formed.

Thus, in the practically usable evaluation of superconducting characteristics of the insulation-coated compound superconducting wire 1, which is a rewindable insulation-coated compound conductive layer wire produced by, for example, the react-and-wind process, and in which the compound superconducting phase includes $Nb_3Sn$, an evaluation value of the measurement condition A, in which the measurement is convenient, can be used as a substitute for an evaluation value of the measurement condition B. In addition, when the compound superconducting phase is other than $Nb_3Sn$, the critical magnetic field and the critical temperature change. Therefore, by appropriately reviewing the magnetic field condition and the temperature condition, the same measurement can be performed.

Further, in both the measurement conditions A and B, the ground based on which the upper limit value of the predetermined tensile stress is set to 250 MPa is as follows.

Non-Patent Documents 5 and 6 disclose that when a tensile stress of about 240 MPa is applied, the critical current value Ic at 4.2 K increases over a wide magnetic field range of from 7 T (tesla) to 15 T due to the room temperature preloading effect on the critical current of the $Nb_3Sn$ multicore superconducting composite wire, but when a tensile stress of more than the above-mentioned amount is applied, breakage of $Nb_3Sn$ filament occurs, and decrease in the critical current value Ic occurs. Therefore, as evaluation conditions for confirming an increase in the critical current value after the formation of electric insulation part, which is an effect of the present invention, the tensile stress of 150 MPa or more and 250 MPa or less, in which 240 MPa is included, and the external magnetic field of 14.5 T are selected.

{Relationship Between Critical Current Value Ic (Maximum Value Thereof) and Tensile Stress}

As another embodiment, it is preferable that the tensile stress when the critical current value Ic of the insulation-coated compound superconducting wire 1 becomes maximum is smaller than that of the compound superconducting wire 10 before being coated with the electric insulation part 30. The relationship between the critical current value Ic (maximum value thereof) and the tensile stress (tensile strain) of the insulation-coated compound superconducting wire 1 can be measured at each stage of the manufacturing process of the insulation-coated compound superconducting wire 1, while conducting electric current through each of the insulation-coated compound superconducting wire 1 and the compound superconducting wire 10 at 4.2 K.

Figure 2:
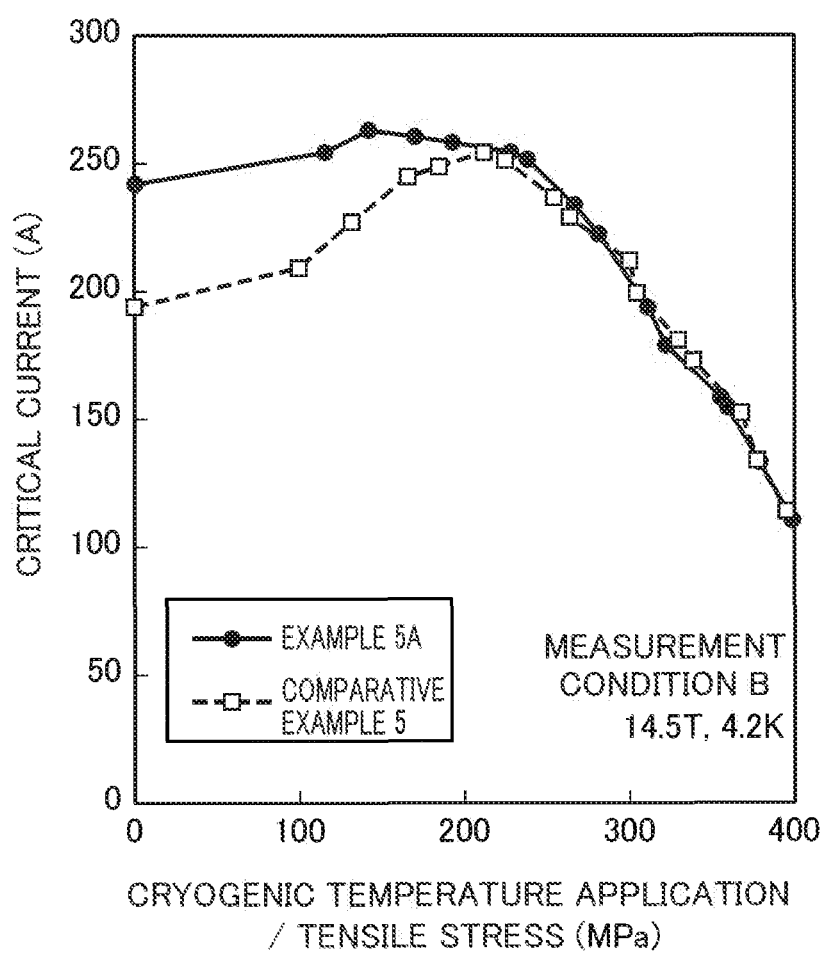
FIG. 2 is a graph of critical currents of the insulation-coated compound superconducting wire of Example 5A and the compound superconducting wire (without insulation coating) of Comparative Example 5 measured under measurement condition B.

In each of the superconducting wires 1 and 10, upon comparing the insulation-coated compound superconducting wire 1 to which the insulation coating has been provided with an electric insulation material such as PVF (polyvinyl formal) and the compound superconducting wire 10 before the electric insulation part 30 is formed, it is seen in the relationship between the critical current value Ic and the tensile stress that the tensile stress at which the critical current value Ic becomes maximum decreases and the maximum value itself of the critical current value Ic increases after the formation of the electric insulation part 30. FIG. 2 is a graph as an example obtained by measuring the critical current value under the measurement condition B with respect to the insulation-coated compound superconducting wire (Example 5A) and the compound superconducting wire (without insulation coating) (Comparative Example 5).

As described above, considering stress relaxation history which is thermally and mechanically generated due to application of the insulation coating with the electric insulation part 30, a pre-bending strain application step is performed. Namely, the electric-insulation part 30 is formed on the outer circumferential surface of the compound superconducting wire 10 so that the maximum value of the critical current value Ic is finally obtained at a smaller tensile strain and smaller tensile stress than when the pre-bending is applied. The stress relaxation history generated thermally and mechanically is imparted, and thereby it is possible to obtain a further increased critical current Ic, compared to the critical current Ic of the compound superconducting wire 10 after performing the pre-bending strain application step.

{Other Embodiments of Insulation-Coated Compound Superconducting Wire}

As another embodiment, heat treatment to form the compound superconducting phase is applied while the compound superconducting precursor strand before the heat treatment to form the compound superconducting phase is bent and wound around a winding member having a bending diameter corresponding to 100 times or larger than the maximum dimension of the compound superconductor part 11; and during a time period after forming the compound superconducting wire 10 by the heat treatment until coating the electric insulation part 30 on the outer circumferential surface of the compound superconducting wire 10 is finished, it is preferable that the tensile strain to the compound superconducting wire is 0.2% or less and the bending strain within ±0.5% to the compound superconductor part 11 is applied in the positive and negative directions at least 10 times within a temperature range from room temperature to 500° C. Thereby, it is possible to properly control the residual strain present in the compound superconducting wire 10 before the electric insulation part is formed.

Further, it is preferable that a mark is provided on the surface of the electric insulation part 30, along the longitudinal direction of the insulation-coated compound superconducting wire, to indicate the direction in which the insulation-coated superconducting wire 1 should be bent. Thereby, in order to properly control the residual strain of the compound superconducting wire, based on the history of the applied direction of the pre-bending strain applied to the insulation-coated compound superconducting wire 1, it is possible to easily know the direction in which the insulation-coated compound superconducting wire 1 should be bent at the time of rewinding the insulation-coated compound superconducting wire 1. For example, when the insulation-coated compound superconducting wire 1 is rewound to a superconducting coil, it is easy to rewind so that the state of the residual strain in the insulation-coated compound superconducting wire 1 does not significantly change. It should be noted that it is sufficient that the mark indicating the direction in which the insulation-coated compound superconducting wire 1 should be bent may be provided so as to show a winding direction, and for example, the mark may be hidden inside rather than on a front side.

Method for Producing Insulation-Coated Compound Superconducting Wire

Figure 3:
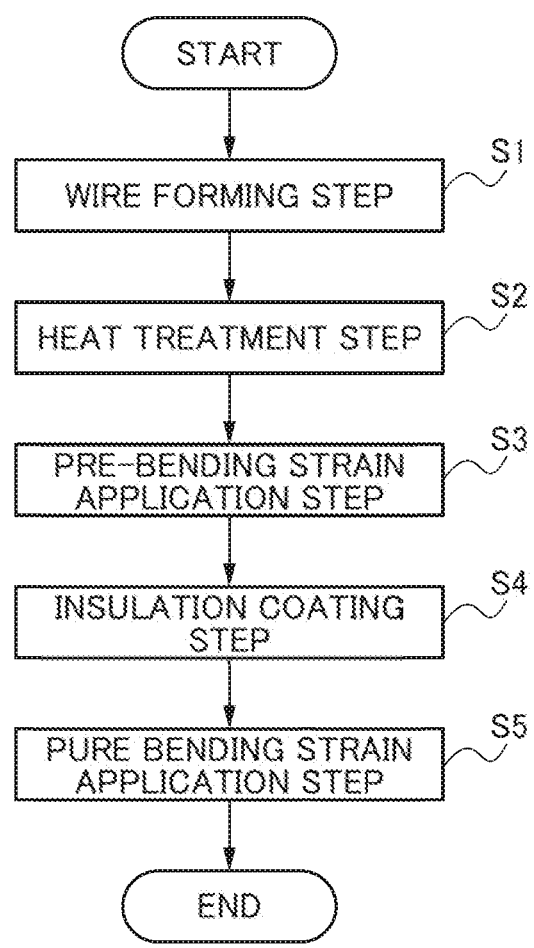
FIG. 3 is a typical process flow chart for illustrating a production method of the insulation-coated compound superconducting wire according to an embodiment of the present invention.

Subsequently, a method for producing the insulation-coated compound superconducting wire 1 of the present embodiment is described below. FIG. 3 is a flow chart showing steps of the production method of the insulation-coated compound superconducting wire of the present embodiment. The method for producing the insulation-coated compound superconducting wire in the embodiment shown in FIG. 3 mainly includes a wire forming step S1, a heat treatment step S2, a pre-bending strain application step S3, an insulation coating step S4, and a pure bending strain application step S5.

By the method for producing the insulation-coated compound superconducting wire of the present embodiment, it is possible to produce coils by the react-and-wind process. Depending upon the cross-sectional structure of the strand, the internal strain of the compound superconductor part 11 is controlled through a series of manufacturing steps S1 to S5 described above, and the wire is less likely to be damaged during the manufacturing. Further, since a method of use with regard to the winding direction when performing winding of a magnet has been clarified, it is possible to obtain excellent electrical conduction characteristics during operation of the produced magnet. Thus, it is possible to design a magnet at a proper operation safety factor, resulting in reduction of a wire cost. Hereinafter, the respective steps are described below by referring, as an example, to an insulation-coated compound superconducting wire, in which the compound superconducting phase includes $Nb_3Sn$, the production method is the bronze process, a composite material including a Cu—Nb alloy is used as the reinforcing part, and enamel coating has been applied.

(Wire Forming Step)

The wire forming step S1 is a step which includes: providing a compound superconducting precursor part including a plurality of Nb filaments and a matrix including a Cu—Sn base alloy in which these Nb filaments are embedded; sequentially arranging on the outer circumferential side of the compound superconducting precursor part, an Sn diffusion prevention part 14, a reinforcing part 12, and a stabilizing part 13 to form a billet; extruding the billet; and then performing wire drawing to form a wire which is a compound superconducting precursor strand before the heat treatment step S2 for forming a compound superconducting phase. As the wire forming step S1, for example, when the compound superconducting phase includes $Nb_3Sn$, a known wire forming step for producing an $Nb_3Sn$ wire such as an internal tin (Sn) diffusion method or a powder in tube (PIT) method can be applied in addition to the above bronze process.

(Heat Treatment Step)

The heat treatment step S2 is a heat treatment step for forming a compound superconducting phase. After performing the heat treatment in the heat treatment step S2, when the temperature is lowered from the heat treatment temperature (e.g., 670° C., 96 hours) to room temperature (e.g., 20° C.), compressive stress (compressive strain) remains in the $Nb_3Sn$ filaments constituting the compound superconductor part 11 and the Sn diffusion prevention part 14 including Ta, Nb, etc., due to difference in the thermal expansion coefficient of members constituting the wire. Further, tensile stress (tensile strain) remains in the first stabilizing material (Cu—Sn base alloy material) of the first matrix constituting the compound superconductor part 11, the second stabilizing material constituting the reinforcing part 12, and the third stabilizing material constituting the stabilizing part 1:3. Under such a state, when a wire in which a reinforcing material is not disposed as described in, for example, Patent Document 1, is stretched or bent at room temperature, the Sn diffusion prevention part 14 which has not yielded, or $Nb_3Sn$ filaments constituting the compound superconductor part 11 serve as a member to be subject to tension within the cross section of the wire.

In contrast, in the present invention, the reinforcing part 12 including Cu—Nb having a large thermal expansion coefficient and large yield stress is disposed on the outer circumference of the $Nb_3Sn$ filament group, and thereby even when the wire is stretched or bent at room temperature, the reinforcing part 12 can be subject to the tension in the cross section of the wire. Therefore, the $Nb_3Sn$ filaments are less likely to be damaged, compared to conventional compound superconducting wire in which a reinforcing part is not disposed and in which only the Sn diffusion prevention part 14 or $Nb_3Sn$ filaments are subject to the tension. Further, by choosing the magnitude of repeated bending strain depending upon the cross-sectional structure of the compound superconducting wire, it is possible to increase the strength in the reinforcing part 12 and relax the compressive stress of the $Nb_3Sn$ filament group, resulting in improvement in the superconductive performance under the use environment of the magnet. If the heat treatment is performed while a compound superconducting wire is wound around a winding member such as a heat treatment bobbin, an $Nb_3Sn$ filament is formed in a shape based on its winding diameter Dh.

(Pre-Bending Strain Application Step)

Figure 4:
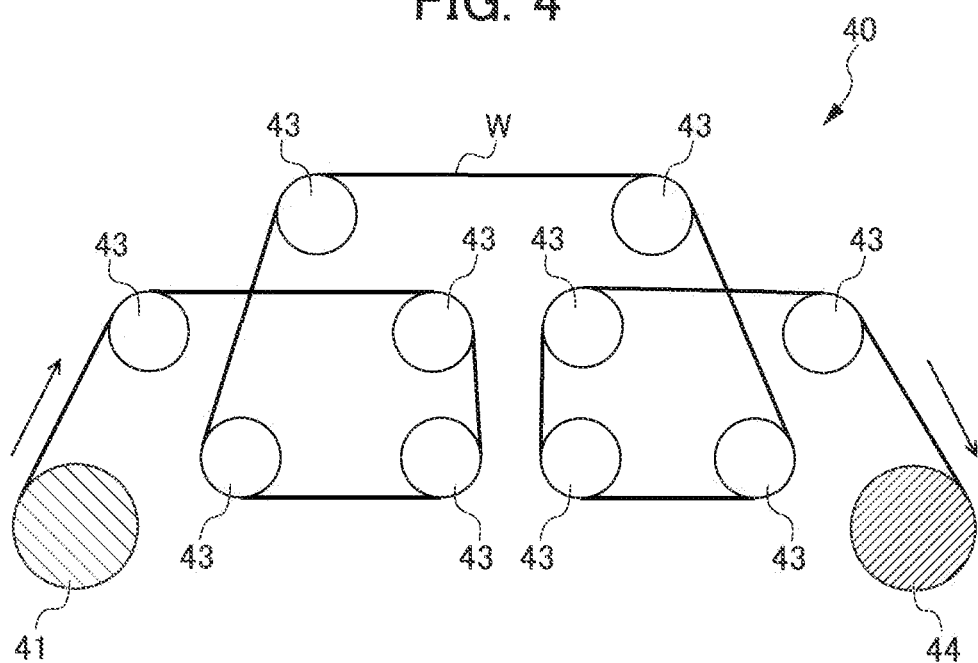
FIG. 4 is a schematic drawing showing an example of arrangement of bending pulleys which constitute a bending strain application apparatus used in pre-bending strain application step S3.
Figure 5:
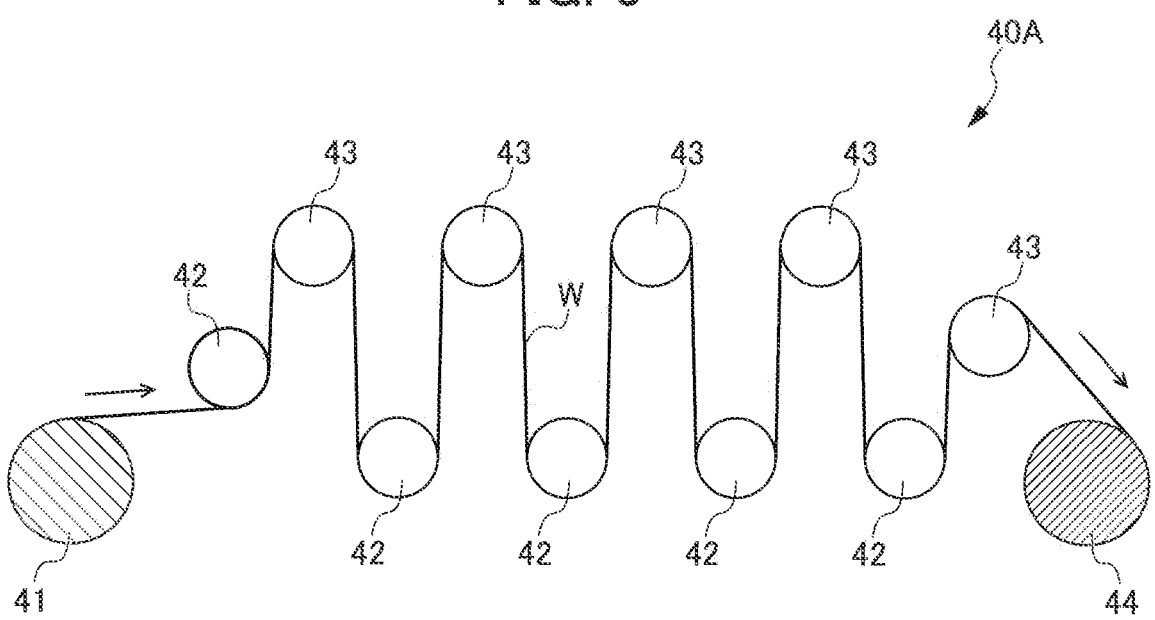
FIG. 5 is a schematic drawing showing another example of arrangement of bending pulleys which constitute the bending strain application apparatus used in pre-bending strain application step S3.

The pre-bending strain application step S3 is a step in which bending procession is applied to the superconducting wire W obtained in the heat treatment step S2, to add a predetermined bending strain. It should be noted that when the critical current value (Ic) of the insulation-coated compound superconducting wire 1 can be increased as compared with that of the compound superconducting wire 10 before being coated with the electric insulation part 30, only by the formation of the electric insulation part 30 to be performed in the subsequent insulation coating step S4, the pre-bending strain application step S3 may be omitted. FIGS. 4 and 5 illustrate an example of the arrangement of bending pulleys constituting the bending strain application apparatus to be used in the pre-bending strain application step S3. In particular, FIG. 4 shows arrangement of pulleys 43 of a bending strain application apparatus 40, in which the superconducting wire W wound around a heat treatment bobbin 41 is linearly wound off without making the superconducting wire W rotate in the axial direction thereof, then the superconducting wire W is made to pass the ten positive direction bending pulleys 43 so that bending strain is sequentially added to the superconducting wire W in the positive direction, and then the superconducting wire W is wound up by the winding member 44. It is possible to apply bending strain in the positive direction 10 times and to apply bending strain in the reverse direction 11 times by returning to linear line state. Meanwhile, FIG. 5 shows arrangement of pulleys of a bending strain application apparatus 40A, in which the superconducting wire W wound around a heat treatment bobbin 41 is linearly wound off without making the superconducting wire W rotate in the axial direction thereof, then the superconducting wire W is made to pass five reverse direction bending pulleys 42 and five positive direction bending pulleys 43 alternatively, so that bending strain in the positive and reverse directions is applied five times each, and then the superconducting wire W is wound up by the winding member 44.

When the superconducting wire W which is wound around the heat treatment bobbin 41 in an arc shape is wound off without making the superconducting wire W to rotate axially and is linearly bent so as to be deformed, the superconducting wire W is subject to bending strain $\varepsilon_{b\text{-}straight}$ indicated in the following equation (1A) due to a curved linear state. More specifically, the superconducting wire W is bent in a straight line from an arc shape, and thereby the outer side portion (outer winding portion) of the surface of the wire W which has been wound around the bobbin 41 is subject to strain in the compression direction (− sign), whereas the inner side portion (inner winding portion) of the surface of the wire W is subject to tensile strain (+ sign) in the direction opposite to the direction in which the outer side of the surface is subject to the compressive strain. Here, the neutral line (or neutral plane) of the bending strain is assumed to be in the center of the wire W.

[Mathematical Formula 1]

$$\varepsilon_{b\text{-}straight} = \pm d\left(-\frac{1}{D_h + d}\right) \cong \mp d\left(\frac{1}{D_h}\right) \quad (1A)$$

Figure 6:
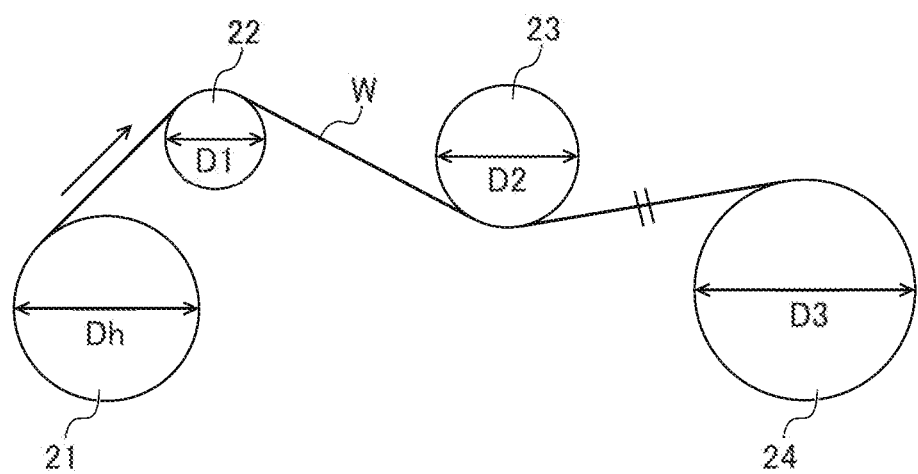
FIG. 6 is a drawing for explaining a bending diameter in the rewinding method of the insulation-coated compound superconducting wire according to the embodiment of the present invention.

Note that d represents the diameter (mm) of the compound superconducting wire 10 constituting the insulation-coated compound superconducting wire 1 (see FIG. 1), and $D_h$ represents the diameter of the heat treatment bobbin 41 (see FIG. 6).

Thereafter, when the insulation-coated compound superconducting wire 1 is wound around a positive direction bending pulley 43 with a diameter of D1, which is arranged in the same direction (positive direction) as when it was wound around the heat treatment bobbin 41, the insulation-coated compound superconducting wire 1 is subject to positive direction bending strain $\varepsilon_{b\text{-}positive}$ indicated in the following formula (2A). More particularly, the outer side portion of the surface of the wire W is subject to tensile strain, and the inner side portion of the surface of the wire W is subject to compressive strain in the direction opposite to the direction in which the outer side portion of the surface is subject to the tensile strain.

[Mathematical Formula 2]

$$\varepsilon_{b\text{-}positive} = \pm d\left(\frac{1}{D_1 + d} - \frac{1}{D_h + d}\right) \cong \pm d\left(\frac{1}{D_1} - \frac{1}{D_h}\right) \quad (2A)$$

Note that d represents the diameter (mm) of the compound superconducting wire 10 constituting the insulation-coated compound superconducting wire 1 (see FIG. 1), and $D_h$ represents the diameter of the heat treatment bobbin 41 (see FIG. 6).

On the other hand, when the insulation-coated compound superconducting wire 1 is wound around a reverse direction bending pulley 42 with a diameter of D2, which is arranged in the opposite direction (reverse direction) as when it was wound around the heat treatment bobbin 41, the insulation-coated compound superconducting wire 1 is subject to reverse direction bending strain $\varepsilon_{b\text{-}negative}$ indicated in the following formula (3A). More specifically, the outer side portion of the surface of the wire W is subject to compressive strain, and the inner side portion of the surface of the wire W is subject to tensile strain in the direction opposite to the direction in which the outer side portion of the surface is subject to the compressive. strain.

[Mathematical Formula 3]

$$\varepsilon_{b\text{-}negative} = \pm d\left(-\frac{1}{D_2 + d} - \frac{1}{D_h + d}\right) \cong \mp d\left(\frac{1}{D_2} + \frac{1}{D_h}\right) \quad (3A)$$

In the pre-bending strain application step including applying repeated bending strain to the wire W after the heat treatment step S3, the bending directivity of the wire W is maintained by controlling the bending direction, bending diameter, and tensile stress. As a result, residual strain distribution in the cross section continuously over the longitudinal direction of the wire W is maintained. Therefore, the stabilizing material located near the neutral line of bending has a lower strength than the stabilizing material located on the outer side or the inner side of the bending direction subject to the bending strain. When a difference is significant, the difference can be detected by micro Vickers hardness test. By controlling a holding direction of the bending directivity of the wire W to the same direction as the bending direction side during heat treatment, more specifically, the spring back direction (the original direction to which the wire tries to return) toward the direction in which the wire has been wound around the heat treatment bobbin in an arc shape, not only in the pre-bending strain application step S3 but also in a subsequent step, reverse direction bending strain exceeding the allowable limit is applied. Thus, it is possible to prevent the compound superconducting filament from being broken. It should be noted that the allowable limit strain at which the compound superconducting filament is broken varies depending on the material of the superconductor, the cross-sectional structure of the wire, the heat treatment condition, the pre-bending strain application condition, etc.

(Insulation Coating Step)

The insulation coating step S4 is a step including coating the outer circumferential surface of the compound superconducting wire 10 with the electric insulation part 30, so that the critical current value (Ic) of the insulation-coated compound superconducting wire 1 coated with the electric insulation part 30 is larger than that of the compound superconducting wire 10 before being coated with the electric insulation part 30.

Specifically, the electric insulation part may be formed in the insulation coating step S4 by setting: the maximum temperature of the compound superconducting wire 10 to less than 500° C.; the maximum value of the bending strain to be applied to the compound superconducting wire 10 to less than the bending strain to be applied in the pre-bending strain application step S3; and the tensile strain to 0.2% or less. The maximum temperature of the compound superconducting wire 10 during forming the electric insulation part of 500° C. or higher is undesirable, since the superconducting properties and mechanical strength may be adversely affected.

Note that, before the insulation coating step S4, it is also possible to further form a heat-resistant plated part 29 having a thickness of 1 μm or less on the outer circumferential surface of the compound superconducting wire 10. The heat-resistant plated part 29 to be applied to the surface of the compound superconducting wire 10 aims at preventing the superconducting wires 10 from adhering to each other to reliably separate the superconducting wires 10 when the superconducting wires 10 are in contact with each other in the heat treatment to form the compound superconducting phase, or at preventing coating malfunction occurrence in the insulation coating step S4. The coating malfunction may be due to irregularity occurrence on the surface of the superconducting wire 10 caused by softening shape change. When the thickness of the heat-resistant plated part 29 is larger than 1 μm, diffusion into the stabilizing part 13 and the stabilizing material of the reinforcing part 12 is occurred during the compound superconducting layer forming heat treatment, this resulting in an increase in the resistance value of the stabilizing material. In addition, there is a possibility of disadvantage in terms of manufacturing cost. Therefore, the thickness of the heat-resistant plated part 29 is preferably equal to or less than 1 μm. It is desirable to select presence or absence of plating depending on the application. Further, the lower limit of the thickness of heat-resistant plated part 29 is not particularly limited, but may be set to 0.1 μm or more from the viewpoint that, in manufacturing, the coating thickness is easily stabilized and the effect of the present invention is easily obtained. Furthermore, not only single metal plating such as Cr, Ni, etc., but also alloy plating such as Ni—P, Ni—B, Cr—C, or Ni—W can be applied as the material. When the compound superconductor is Nb$_3$Sn, the plating material is preferably Cr.

(Pure Bending Strain Application Step)

The pure bending strain application step S5 is a step including winding the insulation-coated compound superconducting wire 1 after the insulation coating step S4 around a winding member 44, while limiting the bending strain $\varepsilon_{pure,bend}$ loaded to the insulation-coated compound superconducting wire, to form the superconducting coil.

The outer side portion of the surface and the inner side portion of the surface of the insulation-coated compound superconducting wire 1 wound around the winding member 44 having a diameter of $D_3$ is subject to the pure bending strain indicated in the following formula (4A).

[Mathematical Formula 4]

$$\varepsilon_{pure.bend} = \pm d\left(\frac{1}{D_3 + d} - \frac{1}{D_h + d}\right) \cong \pm d\left(\frac{1}{D_3} - \frac{1}{D_h}\right) \quad (4A)$$

The maximum bending strain to which the filament in the outer circumferential portion of the group of filaments is subject can be calculated by replacing dimension d as a reference in the formulas (1A) to (4A) with a diameter (diameter of the group of filaments) dfb of the compound superconductor part 11. It should be noted that the neutral line of the bending strain is assumed to be in the center of the group of filaments.

Given that bending strain when the wire is wound off from the heat treatment bobbin with a drum diameter of Dh and is made linear is ε0 ($=\varepsilon_{fb\text{-}straight}$), ε0 can be represented by the following formula (1B).

[Mathematical Formula 5]

$$\varepsilon_{fb\text{-}straight} = \pm d_{fb}\left(-\frac{1}{D_h + d}\right) \cong \mp d_{fb}\left(\frac{1}{D_h}\right) \quad (1B)$$

Given that positive direction bending strain when the wire is bent in the positive direction by the positive direction bending pulley 43 having a diameter of D1 is ε1 ($=\varepsilon_{fb\text{-}positive}$), ε1 can be represented by the following formula (2B).

[Mathematical Formula 6]

$$\varepsilon_{fb\text{-}positive} = \pm d_{fb}\left(\frac{1}{D_1 + d} - \frac{1}{D_h + d}\right) \cong \pm d_{fb}\left(\frac{1}{D_1} - \frac{1}{D_h}\right) \quad (2B)$$

Given that reverse direction bending strain when the wire is bent in the reverse direction by the reverse direction bending pulley 42 having a diameter of D2 is ε2 ($=\varepsilon_{fb\text{-}negative}$), ε2 can be represented by the following formula (3B).

[Mathematical Formula 7]

$$\varepsilon_{fb\text{-}negative} = \pm d_{fb}\left(-\frac{1}{D_2 + d} - \frac{1}{D_h + d}\right) \cong \mp d_{fb}\left(\frac{1}{D_2} + \frac{1}{D_h}\right) \quad (3B)$$

Given that pure bending strain when the wire is bent and wound in the positive direction around a drum with a diameter of D3 after the insulation processing is ε3 ($=\varepsilon_{fb\text{-}pure,bend}$), ε3 can be represented by the following formula (4B).

[Mathematical Formula 8]

$$\varepsilon_{fb\text{-}pure.bend} = \pm d_{fb}\left(\frac{1}{D_3 + d} - \frac{1}{D_h + d}\right) \cong \pm d_{fb}\left(\frac{1}{D_3} - \frac{1}{D_h}\right) \quad (4B)$$

The maximum strain subject to the compound superconducting filament can be discussed by summing up the tensile strain by tension in the axial direction and the maximum tensile bending strain which is applied during wire winding due to the bending diameter. That is, it is necessary for the maximum strain subject to the compound superconducting filament not to exceed the strain at which filament damage occurs. In particular, as indicated by the formula (3B), it is necessary to control the maximum strain applied when the wire is bent in the reverse direction with respect to the bending direction during the heat treatment. Further, operation current of the magnet is decided by considering the superconducting characteristics under the maximum pure bending strain to which the filament is subject after magnet wire winding indicated by the formula (4B).

Method for Rewinding Insulation-Coated Compound Superconducting Wire

The method for rewinding the insulation-coated compound superconducting wire according to the present invention is a rewinding method of the insulation-coated compound superconducting wire described above. As shown in FIG. 6, when the insulation-coated compound superconducting wire W is rewound from a first winding member, e.g., a heat treatment bobbin 21, to a second winding member, e.g., a winding-up bobbin 24 for forming, for example, a superconducting coil, via a positive direction bending pulley 22 and a reverse direction bending pulley 23, it is preferred that the insulation-coated compound superconducting wire 1 is wound off (unwound) from the heat treatment bobbin 21 in the tangential direction of the heat treatment bobbin 21 and wound up around the winding-up bobbin 24 while bending the insulation-coated compound superconducting wire 1 in the same direction as the direction in which the insulation-coated compound superconducting wire 1 has been wound around the heat treatment bobbin 21.

OTHER EMBODIMENTS

It should be noted that the embodiments described above are exemplified to facilitate understanding of specific embodiments of the present invention and the present invention is not limited to these embodiments. The present invention should be widely construed, without violating the spirit and range of the invention disclosed in the claims. The explanation above is given focusing on the structure of a strand having a round cross section having a diameter of d and a diameter of the group of superconducting filaments of $d_{fb}$. However, with respect to the effects of the present invention, similar effects can be obtained even when the cross section is rectangular, etc. When the cross section has a rectangular shape with a thickness of $d^t$ and a width of $d^w$, as the thickness dimension of the group of superconducting filaments $d_{fb}{}^t$ and the width dimension $d_{fb}{}^w$, values of d and $d_{fb}$ in the case of a round wire are replaced with $d^t$ and $d_{fb}{}^t$ when the wire is bent in a flatwise direction and are replaced with $d^w$ and $d_{fb}{}^w$ when the wire is bent in an edgewise direction.

The insulation-coated compound superconducting wire 1 in the present invention maintains its wire winding direction during the heat treatment step for forming the compound superconducting phase in the processing onward until a superconducting magnet is wound. A good wire winding property can be obtained by making a winding direction of a wire to a magnet identical to the winding direction in the heat treatment step. In the case of a general compound superconducting wire such as $Nb_3Sn$ superconducting wire, deterioration of the insulation-coated compound superconducting wire 1 can be suppressed by winding the wire around a winding member (e.g., superconducting coil) having a diameter (drum diameter) to which bending strain being 0.5% or more of the maximum dimension $d_{fb}$ of the compound superconductor part 11 is not applied, in the same direction as the direction in which the wire is wound around the heat treatment bobbin.

<Use of Insulation-Coated Compound Superconducting Wire>

The insulation-coated compound superconducting wire 1 of the present invention is preferably used for a magnet in MRI (magnetic resonance imaging apparatus), medical particle accelerators, magnets for scientific research (e.g., magnetization measuring apparatus), magnets for manufacturing instruments in a variety of industries such as semiconductors, and magnets for generating high magnetic field.

EXAMPLES

Below, the present invention is further described in detail based on the Examples, but the present invention is not limited only to these Examples.

Test Example 1

Example 1

An Nb filament, which was a precursor of a compound superconducting filament before heat treatment, was embedded in a first matrix precursor, which was before being subjected to heat treatment and which consisted of Cu-14 mass % Sn-0.2 mass % Ti. A plurality of the above was bundled and twisted to form a compound superconducting precursor part. Additionally, an Sn diffusion prevention part consisting of Nb was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a diameter of 0.80 mm. The diameter of the Nb filament, which is a superconducting precursor, was set to about 3 μm. The compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively. Subsequently, heat treatment for forming the compound superconducting phase was carried out at 670° C. for 96 hours, while the $Nb_3Sn$ superconducting precursor strand was wound around a heat treatment bobbin having a diameter $D_h$; of 500 mm so that the bending diameter was 100 times or larger than the maximum dimension $d_{fb}$ (0.51 mm) of the compound superconductor part. The compound superconducting precursor part was converted to a compound superconductor part, and thereby an $Nb_3Sn$ superconducting strand was produced. Subsequently, using the pre-bending application apparatus shown in FIG. 5, the $Nb_3Sn$ superconducting strand was reverted to a linear state without bending in the reverse direction with respect to the bending direction during the heat treatment. Then, using a same direction (positive direction) bending pulley having a diameter D1 of 125 mm and an opposite direction (reverse direction) bending pulley having a diameter D2 of 250 mm, bending strain within ±0.31% in the positive direction and the reverse direction alternatively 5 times each, i.e., 10 times in total were applied to the compound superconductor part. Subsequently, an electric insulation part consisting of polyvinyl formal (PVF) of 20 μm was formed around the outer circumference of the $Nb_3Sn$ superconducting strand, which is a compound superconducting wire, to produce an insulation-coated compound superconducting wire. During a time period after the $Nb_3Sn$ formation heat treatment until finishing the electric insulation coating, the tensile strain applied to the $Nb_3Sn$ superconducting strand was 0.2% or less, bending strain applied to the compound superconductor part was within a range of ±0.5%, and the temperature was in a range from room temperature to 500° C.

Comparative Example 1A

A compound superconducting wire having the same configuration as Example 1 was prepared, except that the electric insulation part was not formed around the outer circumference of the $Nb_3Sn$ superconducting strand.

Comparative Example 1B

A compound superconducting wire having the same configuration as Example 1 was prepared, except that the reinforcing part was not disposed, the stabilizing part had a volume ratio of 55%, and the electric insulation part was not formed around the outer circumference of the $Nb_3Sn$ superconducting strand.

Example 2

An Nb filament, which was a precursor of a compound superconducting filament before heat treatment, was embedded in a first matrix precursor, which was before being subjected to heat treatment and which consisted of Cu-14 mass % Sn-0.2 mass % Ti. A plurality of the above was bundled and twisted to form a compound superconducting precursor part. Additionally, an Sn diffusion prevention part consisting of Nb was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a diameter of 0.80 mm. The diameter of the Nb filament, which is a superconducting precursor, was set to about 3 μm. The compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively. Subsequently, heat treatment for forming the compound superconducting phase was carried out at 670° C. for 96 hours, while the $Nb_3Sn$ superconducting precursor strand was wound around a heat treatment bobbin having a diameter $D_h$, of 150 mm so that the bending diameter was 100 times or larger than the maximum dimension $d_{fb}$ (0.51 mm) of the compound superconductor part. The compound superconducting precursor part was converted to a compound superconductor part, and thereby an $Nb_3Sn$ superconducting strand was produced. Subsequently, using the pre-bending application apparatus (one direction bending) shown in FIG. 4, the $Nb_3Sn$ superconducting strand was reverted to a linear state with respect to the bending direction during the heat treatment. Then, using only a same direction (positive direction) bending pulley having a diameter D1 of 250 mm, reverse direction bending strain of −0.34% of eleven times in total by reverting to the linear state were applied to the compound superconductor part. Subsequently, an electric insulation part consisting of polyvinyl formal (PVF) of 40 μm was formed around the outer circumference of the $Nb_3Sn$ superconducting strand, which is a compound superconducting wire, to produce an insulation-coated compound superconducting wire. During a time period after the $Nb_3Sn$ formation heat treatment until finishing the electric insulation coating, the tensile strain applied to the $Nb_3Sn$ superconducting strand was 0.2% or less, bending strain applied to the compound superconductor part was within a range of ±0.5%, and the temperature was in a range from room temperature to 500° C.

Comparative Example 2

A compound superconducting wire having the same configuration as Example 2 was prepared, except that the electric insulation part was not formed around the outer circumference of the $Nb_3Sn$ superconducting strand.

Example 3

A Nb filament, which is a precursor of a compound superconducting filament before heat treatment, was embedded in a first matrix precursor, which was before being subjected to heat treatment and which consisted of Cu-14 mass % Sn-0.2 mass % Ti. A plurality of the above was bundled and twisted to form a compound superconducting precursor part. Additionally, an Sn diffusion prevention part consisting of Ta was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a diameter of 0.80 mm. The diameter of the Nb filament, which is a superconducting precursor, was set to about 3 μm. The compound superconducting precursor part, the Sn diffusion prevention part, the reinforcing part and the stabilizing part, which constitute the $Nb_3Sn$ superconducting precursor strand, had a volume ratio of 41%, 4%, 35%, and 20%, respectively. Subsequently, heat treatment for forming the compound superconducting phase was carried out at 670° C. for 96 hours, while the $Nb_3Sn$ superconducting precursor strand was wound around a heat treatment bobbin having a diameter $D_h$ of 500 mm so that the bending diameter was 100 times or larger than the maximum dimension $d_{fb}$ (0.51 mm) of the compound superconductor part. The compound superconducting precursor part was converted to a compound superconductor part, and thereby an $Nb_3Sn$ superconducting strand was prepared. Subsequently, using the pre-bending application apparatus shown in FIG. 5, the $Nb_3Sn$ superconducting strand was reverted to a linear state without bending in the reverse direction with respect to the bending direction during the heat treatment. Then, using a same direction (positive direction) bending pulley having a diameter D1 of 125 mm and an opposite direction (reverse direction) bending pulley having a diameter D2 of 250 mm, bending strain within 10.31% in the positive direction and the reverse direction alternatively 5 times each, i.e., 10 times in total were applied to the compound superconductor part. Subsequently, an electric insulation part consisting of polyvinyl formal (PVF) of 40 μm was formed around the outer circumference of the $Nb_3Sn$ superconducting strand, which is a compound superconducting wire, to produce an insulation-coated compound superconducting wire. During a time period after the $Nb_3Sn$ formation heat treatment until finishing the electric insulation coating, the tensile strain applied to the $Nb_3Sn$ superconducting strand was 0.2% or less, bending strain applied to the compound superconductor part was within a range of ±0.5%, and the temperature was in a range from room temperature to 500° C.

Comparative Example 3

A compound superconducting wire having the same configuration as Example 3 was prepared, except that the electric insulation part was not formed around the outer circumference of the $Nb_3Sn$ superconducting strand.

Example 4A

A Nb filament, which is a precursor of a compound superconducting filament before heat treatment, was embedded in a first matrix precursor, which was before being subjected to heat treatment and which consisted of Cu-14 mass % Sn-0.2 mass % Ti. A plurality of the above was bundled and twisted to form a compound superconducting precursor part. Additionally, an Sn diffusion prevention part consisting of Ta was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a diameter of 0.80 mm. The diameter of the Nb filament, which is a superconducting precursor, was set to about 3 μm. The compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively. Subsequently, heat treatment for forming the compound superconducting phase was carried out at 670° C. for 96 hours, while the $Nb_3Sn$ superconducting precursor strand was wound around a heat treatment bobbin having a diameter $D_h$ of 500 mm so that the bending diameter was 100 times or larger than the maximum dimension $d_{fb}$ (0.51 mm) of the compound superconductor part. The compound superconducting precursor part was converted to a compound superconductor part, and thereby an $Nb_3Sn$ superconducting strand was produced. Subsequently, the $Nb_3Sn$ superconducting strand was reverted to a linear state without bending in the reverse direction with respect to the bending direction during the heat treatment. Then, using a same direction (positive direction) bending pulley having a diameter D1 of 165 mm and an opposite direction (reverse direction) bending pulley having a diameter D2 of 400 mm, positive direction bending strain of +0.21% of twice and reverse direction bending strain of −0.23% of once were applied to the compound superconductor part. Subsequently, an electric insulation part consisting of polyvinyl formal (PVF) of 40 μm was formed around the outer circumference of the $Nb_3Sn$ superconducting strand, which is a compound superconducting wire, to produce an insulation-coated compound superconducting wire. During a time period after the $Nb_3Sn$ formation heat treatment until finishing the electric insulation coating, the tensile strain applied to the $Nb_3Sn$ superconducting strand was 0.2% or less, bending strain applied to the compound superconductor part was within a range of ±0.5%, and the temperature was in a range from room temperature to 500° C.

Example 4B

A compound superconducting wire having the same configuration as Example 4A was prepared, except that a chromium (Cr) plating of 0.5 μm was applied on the surface of the $Nb_3Sn$ superconducting precursor strand having a diameter of 0.80 mm.

Comparative Example 4

A compound superconducting wire having the same configuration as Example 4A was prepared, except that the electric insulation part was not formed around the outer circumference of the $Nb_3Sn$ superconducting strand.

Example 5A

A Nb filament, which is a precursor of a compound superconducting filament before heat treatment, was embedded in a first matrix precursor, which was before being subjected to heat treatment and which consisted of Cu-15.7 mass % Sn-0.3 mass % Ti. A plurality of the above was bundled and twisted to form a compound superconducting precursor part. Additionally, an Sn diffusion prevention part consisting of Ta was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a diameter of 1.30 mm. The diameter of the Nb filament, which is a superconducting precursor, was set to about 3 μm. The compound superconducting precursor part, the Sn diffusion prevention part, the reinforcing part and the stabilizing part, which constitute the $Nb_3Sn$ superconducting precursor strand, had a volume ratio of 36%, 4%, 40%, and 20?, respectively. Subsequently, heat treatment for forming the compound superconducting phase was carried out at 670° C. for 96 hours, while the $Nb_3Sn$ superconducting precursor strand was wound around a heat treatment bobbin having a diameter $D_h$ of 700 mm so that the bending diameter was 100 times or larger than the maximum dimension $d_{fb}$ (0.78 mm) of the compound superconductor part. The compound superconducting precursor part was converted to a compound superconductor part, and thereby an $Nb_3Sn$ superconducting strand was produced. Subsequently, the $Nb_3Sn$ superconducting strand was reverted to a linear state without bending in the reverse direction with respect to the bending direction during the heat treatment. Then, using only a same direction (positive direction) bending pulley having a diameter D1 of 270 mm, positive direction bending strain of +0.18% of 10 times and reverse direction bending strain of −0.11% of 11 times were applied to the compound superconductor part. Subsequently, an electric insulation part consisting of polyvinyl formal (PVF) of 40 μm was formed around the outer circumference of the $Nb_3Sn$ superconducting strand, which is a compound superconducting wire, to produce an insulation-coated compound superconducting wire. During a time period after the $Nb_3Sn$ formation heat treatment until finishing the electric insulation coating, the tensile strain applied to the $Nb_3Sn$ superconducting strand was 0.2% or less, bending strain applied to the compound superconductor part was within a range of ±0.5%, and the temperature was in a range from room temperature to 500° C.

Example 5B

An insulation-coated compound superconducting wire having the same configuration as Example 5A was prepared, except that the electric insulation part (total thickness of 50 μm) was formed by winding polyimide tape with a thickness of 25 μm around the outer circumference of the $Nb_3Sn$ superconducting strand, which is a compound superconducting wire, by ⅓ lap.

Comparative Example 5

A compound superconducting wire having the same configuration as Example 5 was prepared, except that the electric insulation part was not formed around the outer circumference of the $Nb_3Sn$ superconducting strand.

Example 6

A Nb filament, which is a precursor of a compound superconducting filament before heat treatment, was embedded in a first matrix precursor, which was before being subjected to heat treatment and which consisted of Cu-15.7 mass % Sn-0.3 mass % Ti. A plurality of the above was bundled and twisted to form a compound superconducting precursor part. Additionally, an Sn diffusion prevention part consisting of Ta was disposed around the outer circumference of the compound superconducting precursor part, a reinforcing part consisting of Cu-25 volume, Nb was disposed around the outer circumference thereof, and a stabilizing part consisting of oxygen free copper was further disposed around the outer circumference thereof to prepare an Nb$_3$Sn superconducting precursor strand having a diameter of 1.02 mm. The diameter of the Nb filament, which is a superconducting precursor, was set to about 3 μm. The compound superconducting precursor part, the Sn diffusion prevention part, the reinforcing part, and the stabilizing part, which constitute the Nb$_3$Sn superconducting precursor strand, had a volume ratio of 25%, 5%, 50%, and 20%, respectively. Subsequently, heat treatment for forming the compound superconducting phase was carried out at 670° C. for 96 hours, while the Nb$_3$Sn superconducting precursor strand was wound around a heat treatment bobbin having a diameter D$_h$ of 500 mm so that the bending diameter was 100 times or larger than the maximum dimension d$_{fb}$ (0.51 mm) of the compound superconductor part. The compound superconducting precursor part was converted to a compound superconductor part, and thereby an Nb$_3$Sn superconducting strand was produced. Subsequently, the Nb$_3$Sn superconducting strand was reverted to a linear state without bending in the reverse direction with respect to the bending direction during the heat treatment. Then, using a same direction (positive direction) bending pulley having a diameter D1 of 125 mm and an opposite direction (reverse direction) bending pulley having a diameter D2 of 250 mm, bending strain within ±0.31% in the positive direction and the reverse direction alternatively 5 times each, i.e., 10 times in total were applied to the compound superconductor part. Subsequently, an electric insulation part consisting of polyvinyl formal (PVF) of 40 μm was formed around the outer circumference of the Nb$_3$Sn superconducting strand, which is a compound superconducting wire, to produce an insulation-coated compound superconducting wire. During a time period after the Nb$_3$Sn formation heat treatment until finishing the electric insulation coating, the tensile strain applied to the Nb$_3$Sn superconducting strand was 0.2% or less, bending strain applied to the compound superconductor part was within a range of ±0.5%, and the temperature was in a range from room temperature to 500° C.

Comparative Example 6

A compound superconducting wire having the same configuration as Example 6 was prepared, except that the electric insulation part was not formed around the outer circumference of the Nb$_3$Sn superconducting strand. Specifications of the configurations of the insulation-coated compound superconducting wires of Examples 1 to 6 and the compound superconducting wires of Comparative Examples 1 to 6 are indicated in Table 1.

(Evaluation Method)

Below, methods of tests and evaluations are described in detail.

(1) Measurement Method of Superconductive Characteristics (Cryogenic Characteristics)

(1-1) Measurement Condition A

Tensile stress of 150, 200, or 250 MPa was applied to the superconducting wire at room temperature with a strain rate of $10^{-4}$ to $10^{-3}$/s, followed by unloading, and then the superconducting wire was cooled to 4.2 K. A critical current value Ic (A) was measured under application of an external magnetic field of 14.5 T. The measurement results of the critical current are shown in Table 2.

(1-2) Measurement Condition B

The superconducting wire was cooled to 4.2 K. A critical current value Ic (A) was measured, by conducting electric current to the superconducting wire while applying tensile stress of 150, 200, or 250 MPa, under application of an external magnetic field of 14.5 T. The measurement results of the critical current are indicated in Table 2.

(2) Measurement of Strength (0.2% Proof Stress) During Tension

Strength was measured at room temperature (25° C.) and cryogenic temperature (4.2 K) according to JIS H 7303: 2013, and 0.2% proof stress was calculated by using an unloading curve. The measurement results are indicated in Table 2.

(3) Wire Winding Property (3-1) Winding-Off Property

The winding-off property was evaluated with or without generation of local wire bending due to drop or the like of the strand, in the work of winding off the superconducting wire which was traversely wound to a bobbin having a drum portion diameter φ of 400.

(3-2) Winding-Up Property

The winding-up property was evaluated with or without occurrence of winding turbulence due to twisting, bending or the like of the wire, in the work of aligned winding the superconducting wire to a bobbin having a drum portion diameter φ of 400.

TABLE 1-1

| | | Item | | Symbol | Unit | Example 1 | Comparative Example 1A |
|---|---|---|---|---|---|---|---|
| Insulation-coated compound superconducting wire | Compound superconducting wire | Strand diameter | | d | mm | 0.80 | 0.80 |
| | | Compound superconducting wire | Type | — | — | Nb$_3$Sn filament and Cu—Sn matrix | Nb$_3$Sn filament and Cu—Sn matrix |
| | | | Diameter of compound superconductor part | dfb | mm | 0.51 | 0.51 |
| | | | Volume ratio of compound superconductor part (Relative to compound superconducting wire) | V1 | % | 41 | 41 |
| | | Reinforcing part | Type | — | — | Cu—Nb | Cu—Nb |
| | | | Volume ratio V2 of reinforcing part (Relative to compound superconducting wire) | V2 | % | 35 | 35 |
| | | | Volume ratio of reinforcing filament (Nb) (Relative to reinforcing part) | V21 | % | 20 | 20 |

TABLE 1-1-continued

| | | | | | | | |
|---|---|---|---|---|---|---|---|
| | | Volume ratio of second stabilizing material (Cu) (Relative to reinforcing part) | V22 | % | | 80 | 80 |
| | Sn diffusion prevention part | Type | — | — | — | Nb | Nb |
| | | Volume ratio of Sn diffusion prevention part (Relative to compound superconducting wire) | V3 | % | | 4 | 4 |
| | Total volume ratio of reinforcing filament and Sn diffusion prevention part (Relative to compound superconducting wire) | | V5 (=V2 · V21/100 + V3) | % | | 11 | 11 |
| | Stabilizing part | Type | — | — | — | Oxygen free copper | Oxygen free copper |
| | | Volume ratio of stabilizing part (third stabilizing material) (Relative to compound superconducting wire) | V4 | % | | 20 | 20 |
| | | Total volume ratio of second and third stabilizing materials (Relative to compound superconducting wire) | V6 (=V2 · V22/100 + V4) | % | | 48 | 48 |
| | Heat-resistant plated part | Type | — | — | — | None | None |
| | | Thickness | — | µm | — | — | — |
| Electric insulation part | | Type | — | — | — | PVF | None |

| | | Item | | Comparative Example 1B | Example 2 | Comparative Example 2 |
|---|---|---|---|---|---|---|
| Insulation-coated compound superconducting wire | Compound superconducting wire | Strand diameter | | 0.80 | 0.80 | 0.80 |
| | | Compound superconducting wire | Type | $Nb_3Sn$ filament and Cu—Sn matrix | $Nb_3Sn$ filament and Cu—Sn matrix | $Nb_3Sn$ filament and Cu—Sn matrix |
| | | | Diameter of compound superconductor part | 0.51 | 0.51 | 0.51 |
| | | | Volume ratio of compound superconductor part (Relative to compound superconducting wire) | 41 | 41 | 41 |
| | | Reinforcing part | Type | None | Cu—Nb | Cu—Nb |
| | | | Volume ratio V2 of reinforcing part (Relative to compound superconducting wire) | — | 35 | 35 |
| | | | Volume ratio of reinforcing filament (Nb) (Relative to reinforcing part) | — | 20 | 20 |
| | | | Volume ratio of second stabilizing material (Cu) (Relative to reinforcing part) | — | 80 | 80 |
| | | Sn diffusion prevention part | Type | Nb | Nb | Nb |
| | | | Volume ratio of Sn diffusion prevention part (Relative to compound superconducting wire) | 4 | 4 | 4 |

TABLE 1-1-continued

|  |  |  |  |  |  |
|---|---|---|---|---|---|
|  | Total volume ratio of reinforcing filament and Sn diffusion prevention part (Relative to compound superconducting wire) |  | 4 | 11 | 11 |
|  | Stabilizing part | Type | Oxygen free copper | Oxygen free copper | Oxygen free copper |
|  |  | Volume ratio of stabilizing part (third stabilizing material) (Relative to compound superconducting wire) | 55 | 20 | 20 |
|  |  | Total volume ratio of second and third stabilizing materials (Relative to compound superconducting wire) | 55 | 48 | 48 |
|  | Heat-resistant plated part | Type | None | None | None |
|  |  | Thickness | — | — | — |
|  | Electric insulation part | Type | None | PVF | None |

TABLE 1-2

| | Item | Symbol | Unit | Example 1 | Comparative Example 1A | Comparative Example 1B | Example 2 | Comparative Example 2 |
|---|---|---|---|---|---|---|---|---|
| Heat treatment step S2 | Diameter of winding member (heat treatment bobbin) | Dh | mm | 500 | 500 | 500 | 150 | 150 |
| | Ratio of heat treatment bobbin diameter/compound superconductor part diameter | Dh/dfb | — | 980 | 980 | 980 | 294 | 294 |
| Pre-bending strain application step S3 | Number of pre-bending strain application (positive direction) | — | times | 5 | 5 | 5 | 11 | 11 |
| | Number of pre-bending strain application (reverse direction) | — | times | 5 | 5 | 5 | 0 | 0 |
| | Number of pre-bending strain application (total) | — | times | 10 | 10 | 10 | 11 | 11 |
| | Diameter of positive direction bending pulley | D1 | mm | 125 | 125 | 125 | 250 | 250 |
| | Diameter of reverse direction bending pulley | D2 | mm | 250 | 250 | 250 | None | None |
| | Positive direction bending strain | ε1 | % | 0.31 | 0.31 | 0.31 | — | — |
| | Reverse direction bending strain | ε2 | % | −0.31 | −0.31 | −0.31 | −0.34 | −0.34 |
| | Maximum tension strain to compound superconducting wire | — | % | 0.1 | 0.1 | 0.1 | 0.1 | 0.1 |
| Insulation coating step S4 | Type of electric insulation part | — | — | PVF | None | None | PVF | None |
| | Thickness of insulation coating | — | μm | 20 | — | — | 40 | — |
| | Maximum temperature during insulation treatment | T1 | °C. | 500° C. or less | — | — | 500° C. or less | — |
| | Maximum tension strain to compound superconducting wire | — | % | 0.1 | 0.1 | 0.1 | 0.1 | 0.1 |
| Pure bending strain application step S5 | Diameter of winding wire for superconducting coil | D3 | mm | 400 | 400 | 400 | 400 | 400 |
| | Pure bending strain | ε3 | % | 0.03 | 0.03 | 0.03 | −0.21 | −0.21 |

TABLE 1-3

| | | Item | | Symbol | Unit | Example 3 | Comparative Example 3 |
|---|---|---|---|---|---|---|---|
| Insulation-coated compound superconducting wire | Compound superconducting wire | Strand diameter | | d | mm | 0.80 | 0.80 |
| | | Compound superconducting wire | Type | — | — | Nb$_3$Sn filament and Cu—Sn matrix | Nb$_3$Sn filament and Cu—Sn matrix |
| | | | Diameter of compound superconductor part | dfb | mm | 0.51 | 0.51 |
| | | | Volume ratio of compound superconductor part (Relative to compound superconducting wire) | V1 | % | 41 | 41 |
| | | Reinforcing part | Type | — | — | Cu—Nb | Cu—Nb |
| | | | Volume ratio V2 of reinforcing part (Relative to compound superconducting wire) | V2 | % | 35 | 35 |
| | | | Volume ratio of reinforcing filament (Nb) (Relative to reinforcing part) | V21 | % | 20 | 20 |
| | | | Volume ratio of second stabilizing material (Cu) (Relative to reinforcing part) | V22 | % | 80 | 80 |
| | | Sn diffusion prevention part | Type | — | — | Ta | Ta |
| | | | Volume ratio of Sn diffusion prevention part (Relative to compound superconducting wire) | V3 | % | 4 | 4 |
| | | Total volume ratio of reinforcing filament and Sn diffusion prevention part (Relative to compound superconducting wire) | | V5 (=V2 · V21/100 + V3) | % | 11 | 11 |
| | | Stabilizing part | Type | — | — | Oxygen free copper | Oxygen free copper |
| | | | Volume ratio of stabilizing part (third stabilizing material) (Relative to compound superconducting wire) | V4 | % | 20 | 20 |
| | | | Total volume ratio of second and third stabilizing materials (Relative to compound superconducting wire) | V6(=V2 · V22/100 + V4) | % | 48 | 48 |
| | | Heat-resistant plated part | Type | — | — | None | None |
| | | | Thickness | — | μm | — | — |
| | Electric insulation part | | Type | — | — | PVF | None |

| | | Item | | | Example 4A | Example 4B | Comparative Example 4 |
|---|---|---|---|---|---|---|---|
| Insulation-coated compound superconducting wire | Compound superconducting wire | Strand diameter | | | 0.80 | 0.80 | 0.80 |
| | | Compound superconducting wire | Type | | Nb$_3$Sn filament and Cu—Sn matrix | Nb$_3$Sn filament and Cu—Sn matrix | Nb$_3$Sn filament and Cu—Sn matrix |
| | | | Diameter of compound superconductor part | | 0.51 | 0.51 | 0.51 |
| | | | Volume ratio of compound superconductor part (Relative to compound superconducting wire) | | 41 | 41 | 41 |
| | | Reinforcing part | Type | | Cu—Nb | Cu—Nb | Cu—Nb |
| | | | Volume ratio V2 of reinforcing part (Relative to compound superconducting wire) | | 35 | 35 | 35 |
| | | | Volume ratio of reinforcing filament (Nb) (Relative to reinforcing part) | | 20 | 20 | 20 |

TABLE 1-3-continued

|  |  |  |  |  |  |
|---|---|---|---|---|---|
|  |  | Volume ratio of second stabilizing material (Cu) (Relative to reinforcing part) | 80 | 80 | 80 |
|  | Sn diffusion prevention part | Type | Ta | Ta | Ta |
|  |  | Volume ratio of Sn diffusion prevention part (Relative to compound superconducting wire) | 4 | 4 | 4 |
|  | Total volume ratio of reinforcing filament and Sn diffusion prevention part (Relative to compound superconducting wire) |  | 11 | 11 | 11 |
|  | Stabilizing part | Type | Oxygen free copper | Oxygen free copper | Oxygen free copper |
|  |  | Volume ratio of stabilizing part (third stabilizing material) (Relative to compound superconducting wire) | 20 | 20 | 20 |
|  |  | Total volume ratio of second and third stabilizing materials (Relative to compound superconducting wire) | 48 | 48 | 48 |
|  | Heat-resistant plated part | Type | None | Cr | None |
|  |  | Thickness | — | 0.5 | — |
| Electric insulation part |  | Type | PVF | PVF | None |

TABLE 1-4

| Item |  | Symbol | Unit | Example 3 | Comparative Example 3 | Example 4A | Example 4B | Comparative Example 4 |
|---|---|---|---|---|---|---|---|---|
| Heat treatment step S2 | Diameter of winding member (heat treatment bobbin) | Dh | mm | 500 | 500 | 500 | 500 | 500 |
|  | Ratio of heat treatment bobbin diameter/compound superconductor part diameter | Dh/dfb | — | 980 | 980 | 980 | 980 | 980 |
| Pre-bending strain application step S3 | Number of pre-bending strain application (positive direction) | — | times | 5 | 5 | 2 | 2 | 2 |
|  | Number of pre-bending strain application (reverse direction) | — | times | 5 | 5 | 1 | 1 | 1 |
|  | Number of pre-bending strain application (total) | — | times | 10 | 10 | 3 | 3 | 3 |
|  | Diameter of positive direction bending pulley | D1 | mm | 125 | 125 | 165 | 165 | 165 |
|  | Diameter of reverse direction bending pulley | D2 | mm | 250 | 250 | 400 | 400 | 400 |
|  | Positive direction bending strain | $\varepsilon 1$ | % | 0.31 | 0.31 | 0.21 | 0.21 | 0.21 |
|  | Reverse direction bending strain | $\varepsilon 2$ | % | −0.31 | −0.31 | −0.23 | −0.23 | −0.23 |
|  | Maximum tension strain to compound superconducting wire | — | % | 0.1 | 0.1 | 0.1 | 0.1 | 0.1 |
| Insulation coating step S4 | Type of electric insulation part | — | — | PVF | None | PVF | PVF | None |
|  | Thickness of insulation coating | — | μm | 40 | — | 40 | 40 | — |
|  | Maximum temperature during insulation treatment | T1 | °C. | 500° C. or less | — | 500° C. or less | 500° C. or less | — |
|  | Maximum tension strain to compound superconducting wire | — | % | 0.1 | 0.1 | 0.1 | 0.1 | 0.1 |
| Pure bending strain application step S5 | Diameter of winding wire for superconducting coil | D3 | mm | 400 | 400 | 400 | 400 | 400 |
|  | Pure bending strain | $\varepsilon 3$ | % | 0.03 | 0.03 | 0.03 | 0.03 | 0.03 |

TABLE 1-5

| Item | | | | Symbol | Unit | Example 5A | Example 5B |
|---|---|---|---|---|---|---|---|
| Insulation-coated compound superconducting wire | Compound superconducting wire | Strand diameter Compound superconducting wire | Type | d — | mm — | 1.30 Nb$_3$Sn filament and Cu—Sn matrix | 1.30 Nb$_3$Sn filament and Cu—Sn matrix |
| | | | Diameter of compound superconductor part | dfb | mm | 0.78 | 0.78 |
| | | | Volume ratio of compound superconductor part (Relative to compound superconducting wire) | V1 | % | 36 | 36 |
| | | Reinforcing part | Type | — | — | Cu—Nb | Cu—Nb |
| | | | Volume ratio V2 of reinforcing part (Relative to compound superconducting wire) | V2 | % | 40 | 40 |
| | | | Volume ratio of reinforcing filament (Nb) (Relative to reinforcing part) | V21 | % | 20 | 20 |
| | | | Volume ratio of second stabilizing material (Cu) (Relative to reinforcing part) | V22 | % | 80 | 80 |
| | | Sn diffusion prevention part | Type | — | — | Ta | Ta |
| | | | Volume ratio of Sn diffusion prevention part (Relative to compound superconducting wire) | V3 | % | 4 | 4 |
| | | Total volume ratio of reinforcing filament and Sn diffusion prevention part (Relative to compound superconducting wire) | | V5 (=V2·V21/100 + V3) | % | 12 | 12 |
| | | Stabilizing part | Type | — | — | Oxygen free copper | Oxygen free copper |
| | | | Volume ratio of stabilizing part (third stabilizing material) (Relative to compound superconducting wire) | V4 | % | 20 | 20 |
| | | | Total volume ratio of second and third stabilizing materials (Relative to compound superconducting wire) | V6(=V2·V22/100 + V4) | % | 52 | 52 |
| | | Heat-resistant plated part | Type | — | — | None | None |
| | | | Thickness | — | μm | — | — |
| | Electric insulation part | | Type | — | — | PVF | Polyimide tape |

| Item | | | | | Comparative Example 5 | Example 6 | Comparative Example 6 |
|---|---|---|---|---|---|---|---|
| Insulation-coated compound superconducting wire | Compound superconducting wire | Strand diameter Compound superconducting wire | Type | | 1.30 Nb$_3$Sn filament and Cu—Sn matrix | 1.02 Nb$_3$Sn filament and Cu—Sn matrix | 1.02 Nb$_3$Sn filament and Cu—Sn matrix |
| | | | Diameter of compound superconductor part | | 0.78 | 0.51 | 0.51 |
| | | | Volume ratio of compound superconductor part (Relative to compound superconducting wire) | | 36 | 25 | 25 |
| | | Reinforcing part | Type | | Cu—Nb | Cu—Nb | Cu—Nb |
| | | | Volume ratio V2 of reinforcing part (Relative to compound superconducting wire) | | 40 | 50 | 50 |
| | | | Volume ratio of reinforcing filament (Nb) (Relative to reinforcing part) | | 20 | 25 | 25 |

TABLE 1-5-continued

|  |  |  |  |  |  |
|---|---|---|---|---|---|
|  |  | Volume ratio of second stabilizing material (Cu) (Relative to reinforcing part) | 80 | 75 | 75 |
|  | Sn diffusion prevention part | Type | Ta | Ta | Nb |
|  |  | Volume ratio of Sn diffusion prevention part (Relative to compound superconducting wire) | 4 | 5 | 5 |
|  | Total volume ratio of reinforcing filament and Sn diffusion prevention part (Relative to compound superconducting wire) |  | 12 | 17.5 | 17.5 |
|  | Stabilizing part | Type | Oxygen free copper | Oxygen free copper | Oxygen free copper |
|  |  | Volume ratio of stabilizing part (third stabilizing material) (Relative to compound superconducting wire) | 20 | 20 | 20 |
|  |  | Total volume ratio of second and third stabilizing materials (Relative to compound superconducting wire) | 52 | 57.5 | 57.5 |
|  | Heat-resistant plated part | Type | None | None | None |
|  |  | Thickness | — | — | — |
| Electric insulation part |  | Type | None | PVF | None |

TABLE 1-6

| | Item | Symbol | Unit | Example 5A | Example 5B | Comparative Example 5 | Example 6 | Comparative Example 6 |
|---|---|---|---|---|---|---|---|---|
| Heat treatment step S2 | Diameter of winding member (heat treatment bobbin) | Dh | mm | 700 | 700 | 700 | 500 | 500 |
| | Ratio of heat treatment bobbin diameter/compound superconductor part diameter | Dh/dfb | — | 897 | 897 | 897 | 980 | 980 |
| Pre-bending strain application step S3 | Number of pre-bending strain application (positive direction) | — | times | 10 | 10 | 10 | 5 | 5 |
| | Number of pre-bending strain application (reverse direction) | — | times | 11 | 11 | 11 | 5 | 5 |
| | Number of pre-bending strain application (total) | — | times | 21 | 21 | 21 | 10 | 10 |
| | Diameter of positive direction bending pulley | D1 | mm | 270 | 270 | 270 | 125 | 125 |
| | Diameter of reverse direction bending pulley | D2 | mm | None | None | None | 250 | 250 |
| | Positive direction bending strain | $\varepsilon_1$ | % | 0.18 | 0.18 | 0.18 | 0.31 | 0.31 |
| | Reverse direction bending strain | $\varepsilon_2$ | % | −0.11 | −0.11 | −0.11 | −0.31 | −0.31 |
| | Maximum tension strain to compound superconducting wire | — | % | 0.1 | 0.1 | 0.1 | 0.1 | 0.1 |
| Insulation coating step S4 | Type of electric insulation part | — | — | PVF | Polyimide tape | None | PVF | None |
| | Thickness of insulation coating | — | μm | 40 | 50 | — | 40 | — |
| | Maximum temperature during insulation treatment | T1 | ° C. | 500° C. or less | 35 | — | 500° C. or less | — |
| | Maximum tension strain to compound superconducting wire | — | % | 0.1 | 0.1 | 0.1 | 0.1 | 0.1 |
| Pure bending strain application step S5 | Diameter of winding wire for superconducting coil | D3 | mm | 400 | 400 | 400 | 400 | 400 |
| | Pure bending strain | $\varepsilon_3$ | % | 0.08 | 0.08 | 0.08 | 0.03 | 0.03 |

TABLE 2-1

| Item | | | | Symbol | Unit | Example 1 | Comparative Example 1A |
|---|---|---|---|---|---|---|---|
| Evaluation of characteristics | Superconducting characteristics (cryogenic characteristics) | General measurement condition | Critical current value when measured after cooling to 4.2 K from room temperature, without applying tensile stress (Measured under application of external magnetic field of 14.5 T) | $Ic_0$ Increasing rate of $Ic_0$ | A % | 115 103 (Compared to Comparative Example 1A) | 112 — |
| | | | Critical current value measured by applying tensile stress of 250 MPa at room temperature, followed by unloading, cooling to 4.2 K in a state of tensile stress unloaded (Measured under application of external magnetic field of 14.5 T) | $Ic_{A-250}$ Increasing rate of $I_{CA-250}$ | A % | 118 105 (Compared to Comparative Example 1A) | 113 — |
| | | Measurement condition A | Critical current value measured by applying tensile stress of 250 MPa at room temperature, followed by unloading, cooling to 4.2 K in a state of tensile stress unloaded (Measured under application of external magnetic field of 14.5 T) | $Ic_{A-200}$ Increasing rate of $Ic_{A-200}$ | A % | 116 103 (Compared to Comparative Example 1A) | 113 — |
| | | | Critical current value measured by applying tensile stress of 150 MPa at room temperature, followed by unloading, cooling to 4.2 K in a state of tensile stress unloaded (Measured under application of external magnetic field of 14.5 T) | $Ic_{A-150}$ Increasing rate of $Ic_{A-150}$ | A % | 113 101 (Compared to Comparative Example 1A) | 112 — |
| | | | Critical current value measured by cooling to 4.2 K while applying tensile stress of 250 MPa (Measured under application of external magnetic field of 14.5 T) | $Ic_{B-250}$ Increasing rate of $Ic_{B-250}$ | A % | 117 106 (Compared to Comparative Example 1A) | 110 — |
| | | Measurement condition B | Critical current value measured by cooling to 4.2 K while applying tensile stress of 200 MPa (Measured under application of external magnetic field of 14.5 T) | $Ic_{B-200}$ Increasing rate of $Ic_{B-200}$ | A % | 120 104 (Compared to Comparative Example 1A) | 115 — |
| | | | Critical current value measured by cooling to 4.2 K while applying tensile stress of 150 MPa (Measured under application of external magnetic field of 14.5 T) | $Ic_{B-150}$ Increasing rate of $Ic_{B-150}$ | A % | 115 105 (Compared to Comparative Example 1A) | 110 — |
| | Tensile characteristics | 0.2% proof stress (25° C.) | | $YS_{25}$ | MPa | 250 | 240 |
| | | 0.2% proof stress (4.2 K) | | $YS_{4.2}$ | MPa | 300 | 280 |
| | Wire winding property | Malfunction during winding-off (presence or absence of generation of local wire bending) | | — | — | Absent | Absent |
| | | Malfunction during winding-up (presence or absence of generation of local wire bending) | | — | — | Absent | Absent |

| Item | | | | Comparative Example 1B | Example 2 | Comparative Example 2 |
|---|---|---|---|---|---|---|
| Evaluation of characteristics | Superconducting characteristics (cryogenic characteristics) | General measurement condition | Critical current value when measured after cooling to 4.2 K from room temperature, without applying tensile stress (Measured under application of external magnetic field of 14.5 T) | 100 — | 101 105 (Compared to Comparative Example 2) | 96 — |

TABLE 2-1-continued

| | | | | | |
|---|---|---|---|---|---|
| | | Measurement condition A | Critical current value measured by applying tensile stress of 250 MPa at room temperature, followed by unloading, cooling to 4.2 K in a state of tensile stress unloaded (Measured under application of external magnetic field of 14.5 T) | 80 | 107 105 (Compared to Comparative Example 2) | 102 — |
| | | | Critical current value measured by applying tensile stress of 250 MPa at room temperature, followed by unloading, cooling to 4.2 K in a state of tensile stress unloaded (Measured under application of external magnetic field of 14.5 T) | 95 — | 106 106 (Compared to Comparative Example 2) | 100 — |
| | | | Critical current value measured by applying tensile stress of 150 MPa at room temperature, followed by unloading, cooling to 4.2 K in a state of tensile stress unloaded (Measured under application of external magnetic field of 14.5 T) | 105 — | 105 107 (Compared to Comparative Example 2) | 98 |
| | | Measurement condition B | Critical current value measured by cooling to 4.2 K while applying tensile stress of 250 MPa (Measured under application of external magnetic field of 14.5 T) | — — | 108 108 (Compared to Comparative Example 2) | 100 — |
| | | | Critical current value measured by cooling to 4.2 K while applying tensile stress of 200 MPa (Measured under application of external magnetic field of 14.5 T) | — — | 112 105 (Compared to Comparative Example 2) | 107 — |
| | | | Critical current value measured by cooling to 4.2 K while applying tensile stress of 150 MPa (Measured under application of external magnetic field of 14.5 T) | — — | 110 105 (Compared to Comparative Example 2) | 105 — |
| | Tensile characteristics | | 0.2% proof stress (25° C.) | 130 | 240 | 230 |
| | | | 0.2% proof stress (4.2 K) | 160 | 290 | 280 |
| | Wire winding property | | Malfunction during winding-off (presence or absence of generation of local wire bending) | Present | Absent | Absent |
| | | | Malfunction during winding-up (presence or absence of generation of local wire bending) | Present | Absent | Absent |

TABLE 2-2

| | | | Item | Symbol | Unit | Example 3 | Comparative Example 3 |
|---|---|---|---|---|---|---|---|
| Evaluation of characteristics | Super conducting characteristics (cryogenic characteristics) | General measurement condition | Critical current value when measured after cooling to 4.2 K from room temperature, without applying tensile stress (Measured under application of external magnetic field of 14.5 T) | $Ic_0$ Increasing rate of $Ic_0$ | A % | 109 110 (Compared to Comparative Example 3) | 99 — |
| | | | Critical current value measured by applying tensile stress of 250 MPa at room temperature, followed by unloading, cooling to 4.2 K in a state of tensile stress unloaded (Measured under application of external magnetic field of 14.5 T) | $I_{C4-250}$ Increasing rate of g $Ic_{A-250}$ | A % | 119 104 (Compared to Comparative Example 3) | 114 — |
| | | | Critical current value measured | $Ic_{A-200}$ | A | 117 | 112 |

TABLE 2-2-continued

| | | | | | | | |
|---|---|---|---|---|---|---|---|
| | Measurement condition A | by applying tensile stress of 250 MPa at room temperature, followed by unloading, cooling to 4.2 K in a state of tensile stress unloaded (Measured under application of external magnetic field of 14.5 T) | Increasing rate of $Ic_{A-200}$ | % | | 104 (Compared to Comparative Example 3) | — |
| | | Critical current value measured by applying tensile stress of 150 MPa at room temperature, followed by unloading, cooling to 4.2 K in a state of tensile stress unloaded (Measured under application of external magnetic field of 14.5 T) | $Ic_{A-150}$ Increasing rate of g $Ic_{A-150}$ | A % | | 114 104 (Compared to Comparative Example 3) | 110 — |
| | | Critical current value measured by cooling to 4.2 K while applying tensile stress of 250 MPa (Measured under application of external magnetic field of 14.5 T) | $Ic_{B-250}$ Increasing rate of $Ic_{B-250}$ | A % | | 120 104 (Compared to Comparative Example 3) | 115 — |
| | Measurement condition B | Critical current value measured by cooling to 4.2 K while applying tensile stress of 200 MPa (Measured under application of external magnetic field of 14.5 T) | $Ic_{B-200}$ Increasing rate of $Ic_{B-200}$ | A % | | 122 104 (Compared to Comparative Example 3) | 117 — |
| | | Critical current value measured by cooling to 4.2 K while applying tensile stress of 150 MPa (Measured under application of external magnetic field of 14.5 T) | $Ic_{B-150}$ Increasing rate of $Ic_{B-150}$ | A % | | 120 104 (Compared to Comparative Example 3) | 115 — |
| Tensile characteristics | 0.2% proof stress (25° C.) | | $YS_{25}$ | MPa | | 250 | 240 |
| | 0.2% proof stress (4.2K) | | $YS_{4.2}$ | MPa | | 300 | 300 |
| Wire winding property | Malfunction during winding-off (presence or absence of generation of local wire bending) | | — | — | | Absent | Absent |
| | Malfunction during winding-up (presence or absence of generation of local wire bending) | | — | — | | Absent | Absent |

| | | | Item | Example 4A | Example 4B | Comparative Example 4 |
|---|---|---|---|---|---|---|
| Evaluation of characteristics | Super conducting characteristics (cryogenic characteristics) | General measurement condition | Critical current value when measured after cooling to 4.2 K from room temperature, without applying tensile stress (Measured under application of external magnetic field of 14.5 T) | 93 112 (Compared to Comparative Example 4) | 94 113 (Compared to Comparative Example 4) | 83 — |
| | | | Critical current value measured by applying tensile stress of 250 MPa at room temperature, followed by unloading, cooling to 4.2 K in a state of tensile stress unloaded (Measured under application of external magnetic field of 14.5 T) | 118 104 (Compared to Comparative Example 4) | 119 105 (Compared to Comparative Example 4) | 113 — |
| | | Measurement condition A | Critical current value measured by applying tensile stress of 250 MPa at room temperature, followed by unloading, cooling to 4.2 K in a state of tensile stress unloaded (Measured under application of external magnetic field of 14.5 T) | 106 102 (Compared to Comparative Example 4) | 107 103 (Compared to Comparative Example 4) | 104 — |
| | | | Critical current value measured by applying tensile stress of 150 MPa at room temperature, followed by unloading, cooling to 4.2 K in a state of tensile stress unloaded (Measured under application of external magnetic field of 14.5 T) | 100 102 (Compared to Comparative Example 4) | 101 103 (Compared to Comparative Example 4) | 98 — |
| | | | Critical current value measured by cooling to 4.2 K while applying tensile stress of 250 MPa (Measured under application of external magnetic field of 14.5 T) | 113 103 (Compared to Comparative Example 4) | 114 104 (Compared to Comparative Example 4) | 110 — |
| | | Measurement condition B | Critical current value measured by cooling to 4.2 K while applying tensile stress of 200 MPa (Measured under application of external magnetic field of 14.5 T) | 107 103 (Compared to Comparative Example 4) | 108 105 (Compared to Comparative Example 4) | 104 — |

TABLE 2-2-continued

|  |  |  |  |  |
|---|---|---|---|---|
|  | Critical current value measured by cooling to 4.2 K while applying tensile stress of 150 MPa (Measured under application of external magnetic field of 14.5 T) | 101<br>103 (Compared to Comparative Example 4) | 103<br>105 (Compared to Comparative Example 4) | 98<br>— |
| Tensile characteristics | 0.2% proof stress (25° C.) | 230 | 240 | 200 |
|  | 0.2% proof stress (4.2K) | 270 | 280 | 240 |
| Wire winding property | Malfunction during winding-off (presence or absence of generation of local wire bending) | Absent | Absent | Absent |
|  | Malfunction during winding-up (presence or absence of generation of local wire bending) | Absent | Absent | Absent |

TABLE 2-3

|  |  |  | Item | Symbol | Unit | Example 5A | Example 5B |
|---|---|---|---|---|---|---|---|
| Evaluation of characteristics | Super conducting characteristics (cryogenic characteristics) | General measurement condition | Critical current value when measured after cooling to 4.2 K from room temperature, without applying tensile stress (Measured under application of external magnetic field of 14.5 T) | $Ic_0$<br>Increasing rate of $Ic_0$ | A<br>% | 259<br>118 (Compared to Comparative Example 5) | 254<br>116 (Compared to Comparative Example 5) |
|  |  | Measurement condition A | Critical current value measured by applying tensile stress of 250 MPa at room temperature, followed by unloading, cooling to 4.2 K in a state of tensile stress unloaded (Measured under application of external magnetic field of 14.5 T) | $I_{CA\text{-}250}$<br>Increasing rate of g $Ic_{A\text{-}250}$ | A<br>% | 283<br>107 (Compared to Comparative Example 5) | 285<br>108 (Compared to Comparative Example 5) |
|  |  |  | Critical current value measured by applying tensile stress of 250 MPa at room temperature, followed by unloading, cooling to 4.2 K in a state of tensile stress unloaded (Measured under application of external magnetic field of 14.5 T) | $Ic_{A\text{-}200}$<br>Increasing rate of g $Ic_{A\text{-}200}$ | A<br>% | 268<br>109 (Compared to Comparative Example 5) | 268<br>109 (Compared to Comparative Example 5) |
|  |  |  | Critical current value measured by applying tensile stress of 150 MPa at room temperature, followed by unloading, cooling to 4.2 K in a state of tensile stress unloaded (Measured under application of external magnetic field of 14.5 T) | $Ic_{A\text{-}150}$<br>Increasing rate of g $Ic_{A\text{-}150}$ | A<br>% | 262<br>111 (Compared to Comparative Example 5) | 263<br>112 (Compared to Comparative Example 5) |
|  |  | Measurement condition B | Critical current value measured by cooling to 4.2 K while applying tensile stress of 250 MPa (Measured under application of external magnetic field of 14.5 T) | $Ic_{B\text{-}250}$<br>Increasing rate of $Ic_{B\text{-}25}$ | A<br>% | 245<br>102 (Compared to Comparative Example 5) | 247<br>102 (Compared to Comparative Example 5) |
|  |  |  | Critical current value measured by cooling to 4.2 K while applying tensile stress of 200 MPa (Measured under application of external magnetic field of 14.5 T) | $Ic_{B\text{-}200}$<br>Increasing rate of $Ic_{B\text{-}200}$ | A<br>% | 257<br>102 (Compared to Comparative Example 5) | 267<br>106 (Compared to Comparative Example 5) |
|  |  |  | Critical current value measured by cooling to 4.2 K while applying tensile stress of 150 MPa (Measured under application of external magnetic field of 14.5 T) | $Ic_{B\text{-}150}$<br>Increasing rate of $Ic_{B\text{-}150}$ | A<br>% | 262<br>111 (Compared to Comparative Example 5) | 268<br>113 (Compared to Comparative Example 5) |
|  | Tensile characteristics | 0.2% proof stress (25° C.) | | $YS_{25}$ | MPa | 250 | 240 |
|  |  | 0.2% proof stress (4.2K) | | $YS_{4.2}$ | MPa | 290 | 270 |
|  | Wire winding property | Malfunction during winding-off (presence or absence of generation of local wire bending) | | — | — | Absent | Absent |
|  |  | Malfunction during winding-up (presence or absence of generation of local wire bending) | | — | — | Absent | Absent |

TABLE 2-3-continued

| | Item | | | Comparative Example 5 | Example 6 | Comparative Example 6 |
|---|---|---|---|---|---|---|
| Evaluation of characteristics | Super conducting characteristics (cryogenic characteristics) | General measurement condition | Critical current value when measured after cooling to 4.2 K from room temperature, without applying tensile stress (Measured under application of external magnetic field of 14.5 T) | 219 | 120 109 (Compared to Comparative Example 6) | 110 |
| | | | Critical current value measured by applying tensile stress of 250 MPa at room temperature, followed by unloading, cooling to 4.2 K in a state of tensile stress unloaded (Measured under application of external magnetic field of 14.5 T) | 264 | 123 107 (Compared to Comparative Example 6) | 115 |
| | | Measurement condition A | Critical current value measured by applying tensile stress of 250 MPa at room temperature, followed by unloading, cooling to 4.2 K in a state of tensile stress unloaded (Measured under application of external magnetic field of 14.5 T) | 247 | 122 108 (Compared to Comparative Example 6) | 113 |
| | | | Critical current value measured by applying tensile stress of 150 MPa at room temperature, followed by unloading, cooling to 4.2 K in a state of tensile stress unloaded (Measured under application of external magnetic field of 14.5 T) | 235 | 121 108 (Compared to Comparative Example 6) | 112 |
| | | | Critical current value measured by cooling to 4.2 K while applying tensile stress of 250 MPa (Measured under application of external magnetic field of 14.5 T) | 241 | 115 105 (Compared to Comparative Example 6) | 110 |
| | | Measurement condition B | Critical current value measured by cooling to 4.2 K while applying tensile stress of 200 MPa (Measured under application of external magnetic field of 14.5 T) | 252 | 113 107 (Compared to Comparative Example 6) | 106 |
| | | | Critical current value measured by cooling to 4.2 K while applying tensile stress of 150 MPa (Measured under application of external magnetic field of 14.5 T) | 237 | 111 108 (Compared to Comparative Example 6) | 103 |
| | Tensile characteristics | | 0.2% proof stress (25° C.) | 220 | 280 | 260 |
| | | | 0.2% proof stress (4.2K) | 260 | 340 | 310 |
| | Wire winding property | | Malfunction during winding-off (presence or absence of generation of local wire bending) | Absent | Absent | Absent |
| | | | Malfunction during winding-up (presence or absence of generation of local wire bending) | Absent | Absent | Absent |

From the evaluation results indicated in Table 2, it can be seen that each of the insulation-coated compound superconducting wires of Examples 1 to 6 had an increased critical current over each of the compound superconducting wires without the insulating coating of Comparative Examples 1 to 6, under any of general measurement condition and the measurement conditions A and B, and had excellent superconducting properties. Further, the insulation-coated compound superconducting wires of Examples 1 to 6 had 0.2% proof stress equal to or larger than that of the compound superconducting wires without the insulating coating of Comparative Examples 1 to 6, and had both a good winding-off property and a good winding-up property. In Example 4B, since Cr plating was applied to the surface of the strand, adhesion between the strands during the $Nb_3Sn$ formation heat treatment was prevented. Consequently, it was confirmed that the quality of the PVF-coated surface was improved over the surface quality of Example 4A. Example 5A exhibited critical current characteristics equivalent to those of Example 5B.

EXPLANATION OF REFERENCE NUMERALS

1 Insulation-coated compound superconducting wire
10 Compound superconducting wire
11 Compound superconductor part
12 Reinforcing part
13 Stabilizing part
14 Sn diffusion prevention layer
15 Compound superconducting filament
16 First matrix
17 Core portion of unreacted Nb
18 Reinforcing filament
19 Second matrix
20, 20a, 20b Second stabilizing material
21, 41 Heat treatment bobbin
22, 43 Positive direction bending pulley
23, 42 Reverse direction bending pulley
24, 44 Winding-up member (or winding-up bobbin)
29 Heat-resistant plated part
30 Electric insulation part

The invention claimed is:

1. An insulation-coated compound superconducting wire, comprising:
a compound superconducting wire comprising a core-like compound superconductor part, a cylindrical reinforcing part, and a cylindrical stabilizing part; and
an electric insulation part coating an outer circumferential surface of the compound superconducting wire,
the core-like compound superconductor part comprises a plurality of compound superconducting filaments and a first matrix, the compound superconducting filaments each comprising a compound superconducting phase, the first matrix comprising the plurality of compound superconducting filaments embedded therein and a first stabilizing material,
the cylindrical reinforcing part is disposed on an outer circumferential side of the compound superconductor part, and comprises a plurality of reinforcing filaments and a second matrix, the second matrix comprising the plurality of reinforcing filaments embedded therein and a second stabilizing material,
wherein the cylindrical stabilizing part is disposed on at least one side of an inner circumferential side and an outer circumferential side of the reinforcing part, and comprises a third stabilizing material,
the insulation-coated compound superconducting wire has a critical current value (Ic) larger than that of the compound superconducting wire before being coated with the electric insulation part,
the compound superconducting phase comprises $Nb_3Sn$, and
each of the critical current value (Ic) is obtained by cooling the insulation-coated compound superconducting wire or the compound superconducting wire before being coated with the electric insulation part to a temperature of 4.2 K, and then conducting electric current through the wire in a state of being applied a predetermined tensile stress of 150 MPa or more and 250 MPa or less and being applied an external magnetic field of 14.5 T.

2. An insulation-coated compound superconducting wire, comprising:
a compound superconducting wire comprising a core-like compound superconductor part, a cylindrical reinforcing part, and a cylindrical stabilizing part; and
an electric insulation part coating an outer circumferential surface of the compound superconducting wire,
wherein the core-like compound superconductor part comprises a plurality of compound superconducting filaments and a first matrix, the compound superconducting filaments each comprising a compound superconducting phase, the first matrix comprising the plurality of compound superconducting filaments embedded therein and a first stabilizing material,
wherein the cylindrical reinforcing part is disposed on an outer circumferential side of the compound superconductor part, and comprises a plurality of reinforcing filaments and a second matrix, the second matrix comprising the plurality of reinforcing filaments embedded therein and a second stabilizing material,
wherein the cylindrical stabilizing part is disposed on at least one side of an inner circumferential side and an outer circumferential side of the reinforcing part, and comprises a third stabilizing material,
wherein the insulation-coated compound superconducting wire has a critical current value (Ic) larger than that of the compound superconducting wire before being coated with the electric insulation part,
wherein the compound superconducting phase comprises $Nb_3Sn$, and
each of the critical current value (Ic) is obtained by applying predetermined tensile stress of 150 MPa or more and 250 MPa or less at room temperature to the insulation-coated compound superconducting wire or the compound superconducting wire before being coated with the electric insulation part, followed by unloading, then cooling the wire to a temperature of 4.2 K, and then conducting electric current through the wire in a state of being unloaded the tensile stress and being applied an external magnetic field of 14.5 T.

3. The insulation-coated compound superconducting wire according to claim 1, wherein the insulation-coated compound superconducting wire has a smaller tensile stress at which the critical current value (Ic) becomes maximum than that of the compound superconducting wire before being coated with the electric insulation part.

4. The insulation-coated compound superconducting wire according to claim 1, further comprising a Sn diffusion prevention part between the compound superconductor part and the reinforcing part.

5. An insulation-coated compound superconducting wire, comprising:
a compound superconducting wire comprising a core-like compound superconductor part, a cylindrical reinforcing part, and a cylindrical stabilizing part; and
an electric insulation part coating an outer circumferential surface of the compound superconducting wire,
wherein the core-like compound superconductor part comprises a plurality of compound superconducting filaments and a first matrix, the compound superconducting filaments each comprising a compound superconducting phase, the first matrix comprising the plurality of compound superconducting filaments embedded therein and a first stabilizing material,
wherein the cylindrical reinforcing part is disposed on an outer circumferential side of the compound superconductor part, and comprises a plurality of reinforcing filaments and a second matrix, the second matrix comprising the plurality of reinforcing filaments embedded therein and a second stabilizing material,
wherein the cylindrical stabilizing part is disposed on at least one side of an inner circumferential side and an outer circumferential side of the reinforcing part, and comprises a third stabilizing material,
wherein the insulation-coated compound superconducting wire has a critical current value (Ic) larger than that of the compound superconducting wire before being coated with the electric insulation part,
wherein the insulation-coated compound superconducting wire further comprising a Sn diffusion prevention part between the compound superconductor part and the reinforcing part, and wherein:
the compound superconducting phase comprises $Nb_3Sn$,
the first stabilizing material comprises Cu or a Cu alloy,
the Sn diffusion prevention part comprises Nb or Ta, or an alloy or composite thereof,
the reinforcing filament comprises at least one metal or an alloy of two or more metals selected from the group consisting of Nb, Ta, V, W, Mo, Fe, Ti, and Hf,
the second stabilizing material comprises Cu or a Cu alloy, and
the third stabilizing material comprises Cu or a Cu alloy.

6. The insulation-coated compound superconducting wire according to claim 1, wherein the electric insulation part comprises a resin material.

7. The insulation-coated compound superconducting wire according to claim 6, wherein the resin material is enamel coating or polyimide tape.

8. The insulation-coated compound superconducting wire according to claim 1, wherein a volume ratio of the reinforcing part relative to the compound superconducting wire is larger than a volume ratio of the compound superconductor part relative to the compound superconducting wire.

9. The insulation-coated compound superconducting wire according to claim 1, wherein a total of a volume ratio of the second stabilizing material relative to the compound superconducting wire and a volume ratio of the third stabilizing material relative to the compound superconducting wire is 45% or more.

10. The insulation-coated compound superconducting wire according to claim 4, wherein a total of a volume ratio of the reinforcing filament relative to the compound superconducting wire and a volume ratio of the Sn diffusion prevention part relative to the compound superconducting wire is 7% or more.

11. The insulation-coated compound superconducting wire according to claim 10, wherein the total of the volume ratio of the reinforcing filament relative to the compound superconducting wire and the volume ratio of the Sn diffusion prevention part relative to the compound superconducting wire is 15% or more.

12. The insulation-coated compound superconducting wire according to claim 1, further comprising a heat-resistant plated part having a thickness of 1 μm or less between the outer circumferential surface of the compound superconducting wire and the electric insulation part.

13. The insulation-coated compound superconducting wire according to claim 1,
wherein the insulation-coated compound superconducting wire is obtained by, within a temperature range from room temperature to 500° C., applying tensile strain of 0.2% or less to the compound superconducting wire and applying bending strain within ±0.5% to the compound superconductor part at least 10 times, between the time of forming the compound superconducting wire by performing heat treatment of the compound superconducting phase in a state of being bent and wound a compound superconducting precursor strand around a winding member with a bending diameter corresponding to 100 times larger than the maximum diameter of the compound superconductor part, and the time of finishing the coating of the electric insulation part to the outer circumferential surface of the compound superconducting wire.

14. The insulation-coated compound superconducting wire according to claim 13, further comprising a mark on a surface of the electric insulation part along a longitudinal direction of the insulation-coated compound superconducting wire, the mark indicating a direction in which the insulation-coated compound superconducting wire should be bent.

15. A method for rewinding the insulation-coated compound superconducting wire according to claim 1, from a first winding member to a second winding member, the method comprising:
winding off the insulation-coated compound superconducting wire from the first winding member in a tangential direction of the first winding member; and
winding the insulation-coated compound superconducting wire around the second winding member, while bending the insulation-coated compound superconducting wire in the same direction as the direction in which the insulation-coated compound superconducting wire was wound around the first winding member.

16. The insulation-coated compound superconducting wire according to claim 2, further comprising a Sn diffusion prevention part between the compound superconductor part and the reinforcing part.

17. The insulation-coated compound superconducting wire according to claim 2, wherein the electric insulation part comprises a resin material.

18. The insulation-coated compound superconducting wire according to claim 2, wherein a volume ratio of the reinforcing part relative to the compound superconducting wire is larger than a volume ratio of the compound superconductor part relative to the compound superconducting wire.

19. The insulation-coated compound superconducting wire according to claim 2, wherein a total of a volume ratio of the second stabilizing material relative to the compound superconducting wire and a volume ratio of the third stabilizing material relative to the compound superconducting wire is 45% or more.

* * * * *